US011039512B2

(12) United States Patent
Qiu et al.

(10) Patent No.: US 11,039,512 B2
(45) Date of Patent: *Jun. 15, 2021

(54) DEFROSTING APPARATUS WITH LUMPED INDUCTIVE MATCHING NETWORK AND METHODS OF OPERATION THEREOF

(71) Applicant: NXP USA, Inc., Austin, TX (US)

(72) Inventors: Xiaofei Qiu, Tempe, AZ (US); James Eric Scott, Gilbert, AZ (US); Lionel Mongin, Chandler, AZ (US); Jérémie Simon, Saubens (FR); Pierre Marie Jean Piel, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 479 days.

This patent is subject to a terminal disclaimer.

(21) Appl. No.: 15/456,398

(22) Filed: Mar. 10, 2017

(65) Prior Publication Data

US 2018/0042074 A1 Feb. 8, 2018

(30) Foreign Application Priority Data

Aug. 5, 2016 (EP) ..................................... 16306023

(51) Int. Cl.
*H05B 6/70* (2006.01)
*H05B 6/62* (2006.01)
(Continued)

(52) U.S. Cl.
CPC ............... *H05B 6/705* (2013.01); *H03H 7/40* (2013.01); *H05B 6/62* (2013.01); *H05B 6/688* (2013.01)

(58) Field of Classification Search
CPC ...... H05B 6/6438; H05B 6/705; H05B 6/688; H05B 6/6467; H05B 6/62; H05B 6/664;
(Continued)

(56) References Cited

U.S. PATENT DOCUMENTS

| 2,868,940 A | 1/1959 | Jennings et al. |
| 4,303,820 A | 12/1981 | Stottmann et al. |

(Continued)

FOREIGN PATENT DOCUMENTS

| CN | 1823683 A | 8/2006 |
| CN | 101161560 A | 4/2008 |

(Continued)

OTHER PUBLICATIONS

Non Final Office Action; U.S. Appl. No. 15/806,075; 9 pages, dated Dec. 11, 2019.

(Continued)

*Primary Examiner* — Dana Ross
*Assistant Examiner* — Michael S. Poetzinger
(74) *Attorney, Agent, or Firm* — Sherry W. Schumm

(57) ABSTRACT

A defrosting system includes an RF signal source, an electrode proximate to a cavity within which a load to be defrosted is positioned, a transmission path between the RF signal source and the electrode, and an impedance matching network electrically coupled along the transmission path between the output of the RF signal source and the electrode. The system also includes power detection circuitry coupled to the transmission path and configured to detect reflected signal power along the transmission path. A system controller is configured to modify, based on the reflected signal power, an inductance value of the impedance matching network to reduce a ratio of the reflected signal power to the forward signal power. The impedance matching network includes a plurality of fixed-value, lumped inductors positioned within a fixed inductor area.

17 Claims, 8 Drawing Sheets

(51) Int. Cl.
*H03H 7/40* (2006.01)
*H05B 6/68* (2006.01)

(58) Field of Classification Search
CPC ... H05B 6/46; H05B 6/48; H05B 6/50; H05B 6/68; H05B 6/645; H03H 7/40; F25D 23/12; F25D 21/08
USPC .................. 219/703, 704, 710, 711, 712
See application file for complete search history.

(56) References Cited

U.S. PATENT DOCUMENTS

| | | | |
|---|---|---|---|
| 4,333,521 A | 6/1982 | Stottman et al. | |
| 4,341,937 A | 7/1982 | Staats | |
| 4,507,530 A | 3/1985 | Smith | |
| 4,771,355 A | 9/1988 | Emery et al. | |
| 4,803,854 A | 2/1989 | Kikuchi et al. | |
| 4,870,235 A | 9/1989 | Steers et al. | |
| 4,874,914 A | 10/1989 | Eke | |
| 4,874,915 A | 10/1989 | Harms et al. | |
| 4,980,530 A | 12/1990 | Butot | |
| 4,984,015 A | 1/1991 | Okino | |
| 5,036,172 A | 7/1991 | Kokkeler et al. | |
| 5,180,895 A | 1/1993 | Briggs et al. | |
| 5,349,166 A | 9/1994 | Taylor | |
| 5,407,524 A | 4/1995 | Patrick et al. | |
| 5,436,433 A | 7/1995 | Kim et al. | |
| 5,507,055 A | 4/1996 | Blauert et al. | |
| 5,512,736 A | 4/1996 | Kang et al. | |
| 5,585,766 A * | 12/1996 | Shel ................. | H01J 37/32183 333/17.3 |
| 5,641,423 A | 6/1997 | Bridges et al. | |
| 5,872,475 A | 2/1999 | Otaka | |
| 6,198,084 B1 | 3/2001 | Kim | |
| 6,247,395 B1 | 6/2001 | Yamamoto | |
| 6,252,354 B1 | 6/2001 | Collins et al. | |
| 6,259,344 B1 | 7/2001 | Heritier-Best et al. | |
| 6,657,173 B2 | 12/2003 | Flugstad et al. | |
| 6,784,405 B2 | 8/2004 | Flugstad et al. | |
| 6,887,339 B1 | 5/2005 | Goodman et al. | |
| 7,761,247 B2 | 7/2010 | Van Zyl | |
| 8,162,932 B2 | 4/2012 | Podhajsky et al. | |
| 8,207,479 B2 | 6/2012 | Ben-Shmuel et al. | |
| 8,375,319 B2 | 2/2013 | Decker et al. | |
| 8,562,793 B2 | 10/2013 | Novak | |
| 9,131,543 B2 | 9/2015 | Ben-Shmuel et al. | |
| 9,215,756 B2 | 12/2015 | Bilchinsky et al. | |
| 9,298,873 B2 | 3/2016 | Ishizuka et al. | |
| 9,306,533 B1 | 4/2016 | Mavretic | |
| 9,337,000 B2 * | 5/2016 | Marakhtanov .... | H01J 37/32183 |
| 9,584,090 B2 * | 2/2017 | Mavretic ................. | H03H 7/40 |
| 9,720,022 B2 * | 8/2017 | Howald ................. | G01R 27/02 |
| 9,755,576 B2 * | 9/2017 | Perreault ............... | H03F 3/2176 |
| 9,809,480 B2 | 11/2017 | Stephenson et al. | |
| 9,967,925 B2 | 5/2018 | Brill | |
| 9,973,167 B2 | 5/2018 | Shi et al. | |
| 10,124,187 B2 | 11/2018 | Schwarz et al. | |
| 10,433,376 B2 | 10/2019 | Chaimov et al. | |
| 2002/0003141 A1 | 1/2002 | Blaker et al. | |
| 2002/0046474 A1 | 4/2002 | Novak et al. | |
| 2003/0205571 A1 | 11/2003 | Flugstad et al. | |
| 2004/0016744 A1 | 1/2004 | Ottaway | |
| 2004/0084380 A1 | 5/2004 | Kicinski | |
| 2006/0081624 A1 | 4/2006 | Takada et al. | |
| 2008/0264800 A1 | 10/2008 | Schlager et al. | |
| 2008/0314999 A1 | 12/2008 | Strand | |
| 2009/0058550 A1 | 3/2009 | Ella et al. | |
| 2009/0194526 A1 | 8/2009 | Buchanan | |
| 2010/0141042 A1 | 6/2010 | Kesler et al. | |
| 2010/0239757 A1 | 9/2010 | Murata | |
| 2010/0247403 A1 | 9/2010 | Hancock | |
| 2011/0176911 A1 | 7/2011 | Couturier et al. | |
| 2011/0278284 A1 | 11/2011 | Tian et al. | |
| 2012/0000888 A1 | 1/2012 | Kawasaki et al. | |
| 2012/0067872 A1 | 3/2012 | Libman et al. | |
| 2012/0075033 A1 | 3/2012 | Ouyang et al. | |
| 2012/0086519 A1 | 4/2012 | Hauer et al. | |
| 2012/0103973 A1 | 5/2012 | Rogers et al. | |
| 2012/0119842 A1 | 5/2012 | Gu et al. | |
| 2012/0122072 A1 | 5/2012 | Bilchinsky et al. | |
| 2012/0164022 A1 | 6/2012 | Muginstein et al. | |
| 2012/0168645 A1 | 7/2012 | Atzmony et al. | |
| 2013/0080098 A1 | 3/2013 | Hadad et al. | |
| 2013/0193913 A1 | 8/2013 | Takada et al. | |
| 2013/0257667 A1 | 10/2013 | Kang | |
| 2013/0284725 A1 | 10/2013 | Bilchinsky et al. | |
| 2013/0119055 A1 | 11/2013 | Wohl et al. | |
| 2013/0334214 A1 | 12/2013 | Yogev et al. | |
| 2014/0167878 A1 | 6/2014 | Lee | |
| 2014/0287100 A1 | 9/2014 | Libman | |
| 2014/0312972 A1 | 10/2014 | Yoneda et al. | |
| 2015/0091440 A1 * | 4/2015 | Marakhtanov .... | H01J 37/32183 315/111.21 |
| 2015/0091441 A1 | 4/2015 | Marakhtanov et al. | |
| 2015/0351164 A1 | 12/2015 | Wesson et al. | |
| 2016/0095196 A1 | 3/2016 | Chen et al. | |
| 2016/0181986 A1 * | 6/2016 | Perreault ............... | H03F 3/2176 330/251 |
| 2016/0221441 A1 | 8/2016 | Hall et al. | |
| 2016/0248396 A1 * | 8/2016 | Mavretic ................. | H03H 7/40 |
| 2016/0308560 A1 | 10/2016 | Howald et al. | |
| 2016/0343548 A1 * | 11/2016 | Howald ................. | G01R 27/02 |
| 2017/0096352 A1 | 4/2017 | Hughes et al. | |
| 2017/0181455 A1 | 6/2017 | Bullo et al. | |
| 2017/0266986 A1 | 9/2017 | Yamada | |
| 2017/0302236 A1 | 10/2017 | Oshita | |
| 2018/0042073 A1 | 2/2018 | Scott et al. | |
| 2018/0062605 A1 | 3/2018 | Brounley et al. | |
| 2018/0115298 A1 | 4/2018 | Fujimoto et al. | |
| 2018/0220499 A1 | 8/2018 | Sims et al. | |
| 2018/0374685 A1 | 12/2018 | Collins et al. | |
| 2019/0008005 A1 | 1/2019 | Dore et al. | |
| 2019/0141799 A1 | 5/2019 | Mongin et al. | |
| 2019/0158039 A1 | 5/2019 | Koya et al. | |
| 2019/0158055 A1 | 5/2019 | Mongin et al. | |
| 2019/0191500 A1 | 6/2019 | Mongin et al. | |
| 2019/0191501 A1 | 6/2019 | Piel et al. | |
| 2019/0306933 A1 | 10/2019 | McCarville et al. | |
| 2019/0320506 A1 | 10/2019 | Guatta et al. | |
| 2020/0084844 A1 | 3/2020 | Qiu et al. | |
| 2020/0092957 A1 | 3/2020 | Ma et al. | |
| 2020/0136497 A1 | 4/2020 | Beck | |
| 2020/0170081 A1 | 5/2020 | McCarville et al. | |

FOREIGN PATENT DOCUMENTS

| | | |
|---|---|---|
| CN | 201914941 U | 8/2011 |
| CN | 102951760 A | 3/2013 |
| CN | 203021337 U | 6/2013 |
| CN | 203247118 U | 10/2013 |
| CN | 103903944 A | 7/2014 |
| CN | 104377106 A | 2/2015 |
| CN | 104782226 A | 7/2015 |
| CN | 104930804 A | 9/2015 |
| CN | 105142253 A | 12/2015 |
| CN | 105206494 A | 12/2015 |
| CN | 105357788 A | 2/2016 |
| CN | 105768922 A | 7/2016 |
| CN | 106225029 A | 12/2016 |
| CN | 106301362 A | 1/2017 |
| CN | 205860137 U | 1/2017 |
| CN | 205919380 U | 2/2017 |
| CN | 206213147 U | 6/2017 |
| CN | 107359705 A | 11/2017 |
| CN | 107373296 A | 11/2017 |
| CN | 206724547 U | 12/2017 |
| CN | 108521691 A | 9/2018 |
| CN | 108812854 A | 11/2018 |
| CN | 208521691 U | 2/2019 |
| DE | 3818491 A1 | 12/1989 |
| DE | 11 2014 001599 T5 | 6/2016 |

(56) References Cited

FOREIGN PATENT DOCUMENTS

| | | | |
|---|---|---|---|
| EP | 0 597 497 A1 | 5/1994 | |
| EP | 1 577 281 A1 | 9/2005 | |
| EP | 01818076 A1 | 8/2007 | |
| EP | 2 445 312 A1 | 4/2012 | |
| EP | 3 240 142 A1 | 11/2017 | |
| GB | 621320 | 4/1949 | |
| GB | 2465442 A | 5/2010 | |
| JP | S5111237 A | 1/1976 | |
| JP | S5111237 A | 1/1976 | |
| JP | 55-44199 | 3/1980 | |
| JP | S56-148273 A | 11/1981 | |
| JP | S5950305 | 12/1984 | |
| JP | 63-207921 | 8/1988 | |
| JP | 3-72840 A | 3/1991 | |
| JP | H0513162 A | 1/1993 | |
| JP | H06215955 A | 8/1994 | |
| JP | H027269868 A | 10/1995 | |
| JP | 08-185966 A | 7/1996 | |
| JP | 8-255682 A | 10/1996 | |
| JP | 10-134953 A | 5/1998 | |
| JP | 2003 332037 A | 11/2003 | |
| JP | 2003-347035 A | 12/2003 | |
| JP | 2004-57101 A | 2/2004 | |
| JP | 20040633008 A | 2/2004 | |
| JP | 2004247128 A | 9/2004 | |
| JP | 2005056781 A | 3/2005 | |
| JP | 20122207900 A | 10/2012 | |
| JP | 2017 182885 A | 10/2017 | |
| JP | 6375032 | 8/2018 | |
| JP | H0327120 U | 3/2019 | |
| KR | 100133085 | 4/1998 | |
| WO | 2007/117754 A2 | 10/2007 | |
| WO | 2010/060233 A1 | 6/2010 | |
| WO | 2012/001523 A1 | 1/2012 | |
| WO | 2012/024517 A1 | 2/2012 | |
| WO | 2013/033330 A1 | 3/2013 | |
| WO | 2014/006510 A2 | 1/2014 | |
| WO | 2014006510 A2 | 1/2014 | |
| WO | 2015/028839 A1 | 3/2015 | |
| WO | 2015/052145 A1 | 4/2015 | |
| WO | 2017/017407 A1 | 2/2017 | |
| WO | 2017/123145 A1 | 7/2017 | |
| WO | WO-2017123145 A1 * | 7/2017 | ............... H05B 6/50 |
| WO | 2017/144873 A1 | 8/2017 | |
| WO | 2018223939 A1 | 12/2018 | |

OTHER PUBLICATIONS

Ameri, M. et al.; "Pattern Matching Algorithm for Identification of Load Mass of an Elastic Robot Arm"; American Control Conference; 2 pages (1988).

Doherty, Mark F. et al; "Automatic Detection of Mass-Resolved Ion Conics"; IEEE Transactions on Geoscience and Remote Sensing, vol. 31, No. 2; 10 pages (Mar. 1993).

Non Final Office Action; U.S. Appl. No. 15/454,345; 17 pages (dated Jun. 12, 2019).

Cottee et al., "Design of Matching Circuit Controllers for Radio-Frequency Heating", IEEE Transactions on Control Systems Technology, vol. 11, No. 1, pp. 91-100, Jan. 2003.

Notice of Allowance; U.S. Appl. No. 15/454,345; 9 pages, (dated Jan. 15, 2020).

Notice of Allowance; U.S. Appl. No. 15/816,802; 5 pages, (dated Jun. 4, 2020).

U.S. Appl. No. 16/225,749, filed Dec. 19, 2018; not yet published; 102 pages.

U.S. Appl. No. 16/230,425; not yet published; 122 Pages, (Dec. 21, 2018).

Final Office Action; U.S. Appl. No. 15/806,075; 11 pages, dated Jun. 19, 2020.

Non Final Office Action; U.S. Appl. No. 15/816,802; 22 pages, dated Feb. 20, 2020.

Non Final Office Action; U.S. Appl. No. 15/923,455; 20 pages, (dated Oct. 29, 2020).

Notice of Allowance; U.S. Appl. No. 15/843,290; 7 pages, (dated Jul. 31, 2020).

Non Final Office Action; U.S. Appl. No. 16/126,963; 15 pages, (dated Jul. 28, 2020).

Non Final Office Action; U.S. Appl. No. 16/917,035; 13 pages, (dated Aug. 3, 2020).

Notice of Allowance; U.S. Appl. No 15/806,075; 10 pages, (dated Oct. 5, 2020).

Final Rejection; U.S. Appl. No. 15/923,455; 22 pages, (dated Feb. 25, 2021).

Non Final Rejection; U.S. Appl. No. 16/131,636; 20 pages, (dated Feb. 23, 2021).

Notice of Allowance; U.S. Appl. No. 16/126,963; 8 pages, (dated Dec. 31, 2020).

Non Final Office Action; U.S. Appl. No. 16/225,749; 10 pages (dated Apr. 7, 2021).

Notice of Allowance; U.S. Appl. No. 16/230,425; 10 pages (dated Apr. 21, 2021).

* cited by examiner

DEFROSTING APPARATUS WITH LUMPED INDUCTIVE MATCHING NETWORK AND METHODS OF OPERATION THEREOF

TECHNICAL FIELD

Embodiments of the subject matter described herein relate generally to apparatus and methods of defrosting a load using radio frequency (RF) energy.

BACKGROUND

Conventional capacitive food defrosting (or thawing) systems include large planar electrodes contained within a heating compartment. After a food load is placed between the electrodes and the electrodes are brought into contact with the food load, low power electromagnetic energy is supplied to the electrodes to provide gentle warming of the food load. As the food load thaws during the defrosting operation, the impedance of the food load changes. Accordingly, the power transfer to the food load also changes during the defrosting operation. The duration of the defrosting operation may be determined, for example, based on the weight of the food load, and a timer may be used to control cessation of the operation.

Although good defrosting results are possible using such systems, the dynamic changes to the food load impedance may result in inefficient defrosting of the food load. In addition, inaccuracies inherent in determining the duration of the defrosting operation based on weight may result in premature cessation of the defrosting operation, or late cessation after the food load has begun to cook. What are needed are apparatus and methods for defrosting food loads (or other types of loads) that may result in efficient and even defrosting throughout the load and cessation of the defrosting operation when the load is at a desired temperature.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the subject matter described herein relate to solid-state defrosting apparatus that may be incorporated into stand-alone appliances or into other systems. As described in greater detail below, exemplary defrosting systems are realized using a first electrode disposed in a cavity, an amplifier arrangement (including one or more transistors), an impedance matching network coupled between an output of the amplifier arrangement and the first electrode, and a measurement and control system that can detect when a defrosting operation has completed. In an embodiment, the impedance matching network is a variable impedance matching network that can be adjusted during the defrosting operation to improve matching between the amplifier arrangement and the cavity.

Generally, the term "defrosting" means to elevate the temperature of a frozen load (e.g., a food load or other type of load) to a temperature at which the load is no longer frozen (e.g., a temperature at or near 0 degrees Celsius). As used herein, the term "defrosting" more broadly means a process by which the thermal energy or temperature of a load (e.g., a food load or other type of load) is increased through provision of RF power to the load. Accordingly, in various embodiments, a "defrosting operation" may be performed on a load with any initial temperature (e.g., any initial temperature above or below 0 degrees Celsius), and the defrosting operation may be ceased at any final temperature that is higher than the initial temperature (e.g., including final temperatures that are above or below 0 degrees Celsius). That said, the "defrosting operations" and "defrosting systems" described herein alternatively may be referred to as "thermal increase operations" and "thermal increase systems." The term "defrosting" should not be construed to limit application of the invention to methods or systems that are only capable of raising the temperature of a frozen load to a temperature at or near 0 degrees Celsius.

Figure 1:
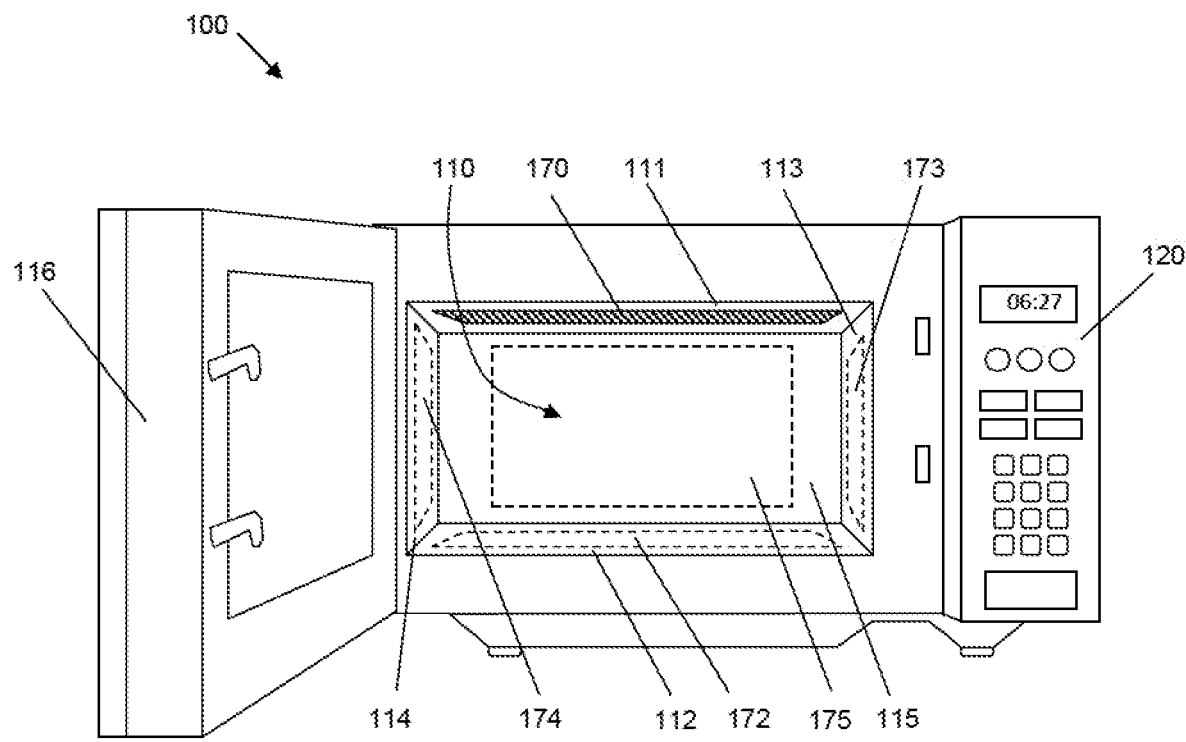
FIG. 1 is a perspective view of a defrosting appliance, in accordance with an example embodiment.

FIG. 1 is a perspective view of a defrosting system 100, in accordance with an example embodiment. Defrosting system 100 includes a defrosting cavity 110, a control panel 120, one or more radio frequency (RF) signal sources (e.g., RF signal source 340, FIG. 3), a power supply (e.g., power supply 350, FIG. 3), a first electrode 170, power detection circuitry (e.g., power detection circuitry 380, FIG. 3), and a system controller (e.g., system controller 330, FIG. 3). The defrosting cavity 110 is defined by interior surfaces of top, bottom, side, and back cavity walls 111, 112, 113, 114, 115 and an interior surface of door 116. With door 116 closed, the defrosting cavity 110 defines an enclosed air cavity. As used herein, the term "air cavity" may mean an enclosed area that contains air or other gasses (e.g., defrosting cavity 110).

According to an embodiment, the first electrode 170 is arranged proximate to a cavity wall (e.g., top wall 111), the first electrode 170 is electrically isolated from the remaining cavity walls (e.g., walls 112-115 and door 116), and the remaining cavity walls are grounded. In such a configuration, the system may be simplistically modeled as a capacitor, where the first electrode 170 functions as one conductive plate, the grounded cavity walls (e.g., walls 112-115) function as a second conductive plate (or electrode), and the air cavity (including any load contained therein) function as a dielectric medium between the first and second conductive plates. Although not shown in FIG. 1, a non-electrically conductive barrier (e.g., barrier 314, FIG. 3) also may be included in the system 100, and the non-conductive barrier may function to electrically and physically isolate the load from the bottom cavity wall 112. Although FIG. 1 shows the first electrode 170 being proximate to the top wall 111, the first electrode 170 alternatively may be proximate to any of the other walls 112-115, as indicated by alternate electrodes 172-175.

According to an embodiment, during operation of the defrosting system 100, a user (not illustrated) may place one or more loads (e.g., food and/or liquids) into the defrosting cavity 110, and optionally may provide inputs via the control panel 120 that specify characteristics of the load(s). For example, the specified characteristics may include an approximate weight of the load. In addition, the specified load characteristics may indicate the material(s) from which the load is formed (e.g., meat, bread, liquid). In alternate embodiments, the load characteristics may be obtained in some other way, such as by scanning a barcode on the load packaging or receiving a radio frequency identification (RFID) signal from an RFID tag on or embedded within the load. Either way, as will be described in more detail later, information regarding such load characteristics enables the system controller (e.g., system controller 330, FIG. 3) to establish an initial state for the impedance matching network of the system at the beginning of the defrosting operation, where the initial state may be relatively close to an optimal state that enables maximum RF power transfer into the load. Alternatively, load characteristics may not be entered or received prior to commencement of a defrosting operation, and the system controller may establish a default initial state for the impedance matching network.

To begin the defrosting operation, the user may provide an input via the control panel 120. In response, the system controller causes the RF signal source(s) (e.g., RF signal source 340, FIG. 3) to supply an RF signal to the first electrode 170, which responsively radiates electromagnetic energy into the defrosting cavity 110. The electromagnetic energy increases the thermal energy of the load (i.e., the electromagnetic energy causes the load to warm up).

During the defrosting operation, the impedance of the load (and thus the total input impedance of the cavity 110 plus load) changes as the thermal energy of the load increases. The impedance changes alter the absorption of RF energy into the load, and thus alter the magnitude of reflected power. According to an embodiment, power detection circuitry (e.g., power detection circuitry 380, FIG. 3) continuously or periodically measures the forward and reflected power along a transmission path (e.g., transmission path 348, FIG. 3) between the RF signal source (e.g., RF signal source 340, FIG. 3) and the first electrode 170. Based on these measurements, the system controller (e.g., system controller 330, FIG. 3) may detect completion of the defrosting operation, as will be described in detail below. According to a further embodiment, the impedance matching network is variable, and based on the forward and reflected power measurements, the system controller may alter the state of the impedance matching network during the defrosting operation to increase the absorption of RF power by the load.

Figure 2:
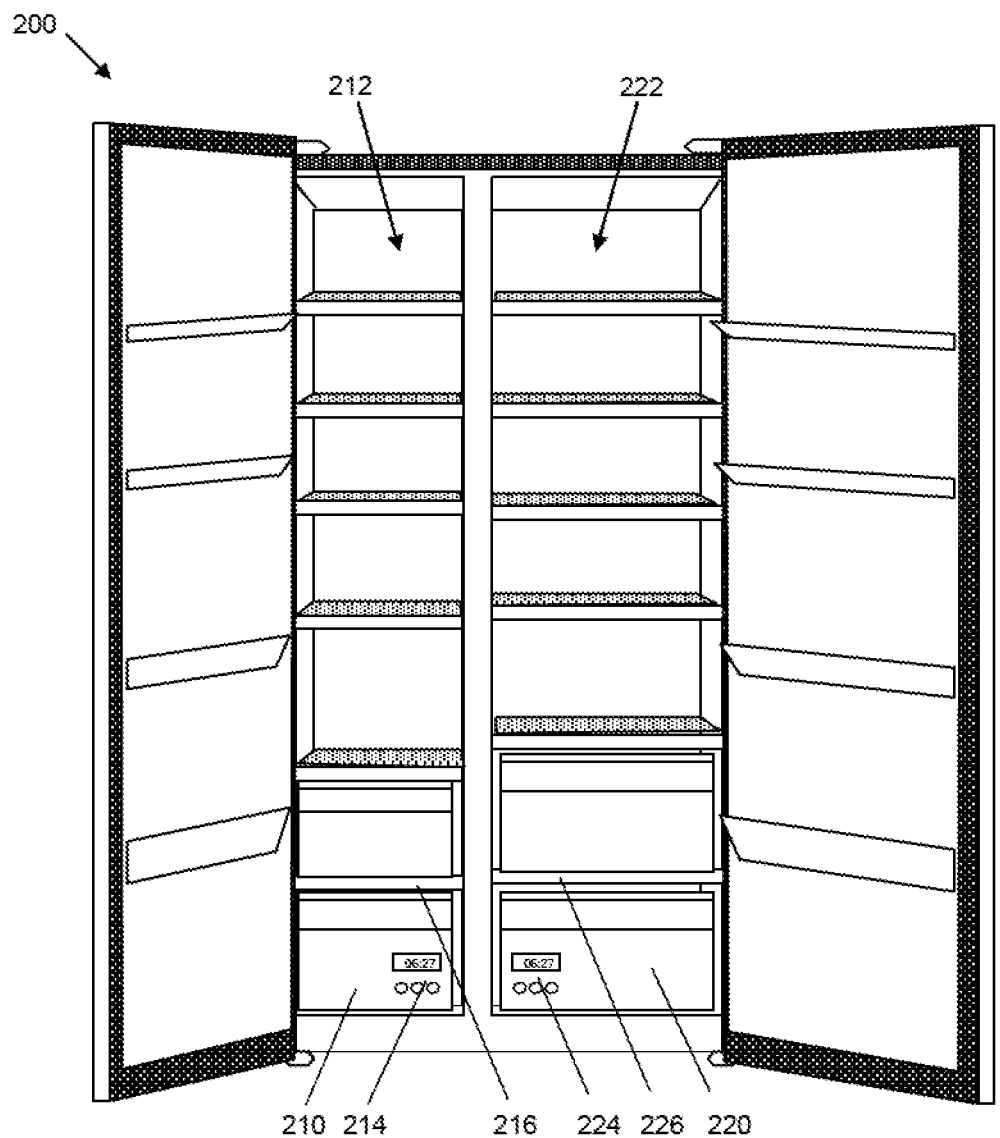
FIG. 2 is a perspective view of a refrigerator/freezer appliance that includes other example embodiments of defrosting systems.

The defrosting system 100 of FIG. 1 is embodied as a counter-top type of appliance. In a further embodiment, the defrosting system 100 also may include components and functionality for performing microwave cooking operations. Alternatively, components of a defrosting system may be incorporated into other types of systems or appliances. For example, FIG. 2 is a perspective view of a refrigerator/freezer appliance 200 that includes other example embodiments of defrosting systems 210, 220. More specifically, defrosting system 210 is shown to be incorporated within a freezer compartment 212 of the system 200, and defrosting system 220 is shown to be incorporated within a refrigerator compartment 222 of the system. An actual refrigerator/freezer appliance likely would include only one of the defrosting systems 210, 220, but both are shown in FIG. 2 to concisely convey both embodiments.

Figure 3:
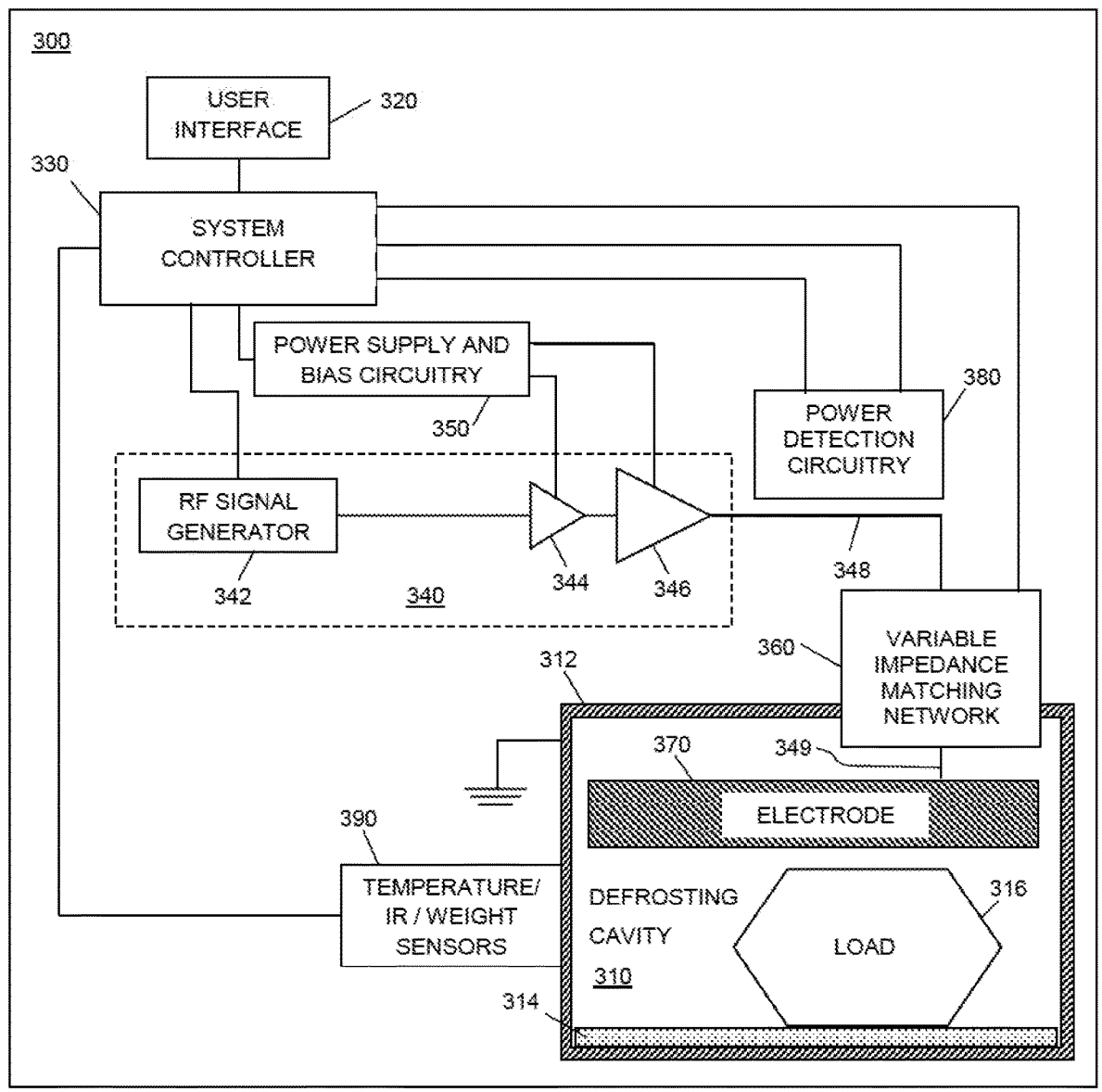
FIG. 3 is a simplified block diagram of a defrosting apparatus, in accordance with an example embodiment.

Similar to the defrosting system 100, each of defrosting systems 210, 220 includes a defrosting cavity, a control panel 214, 224, one or more RF signal sources (e.g., RF signal source 340, FIG. 3), a power supply (e.g., power supply 350, FIG. 3), a first electrode (e.g., electrode 370, FIG. 3), power detection circuitry (e.g., power detection circuitry 380, FIG. 3), and a system controller (e.g., system controller 330, FIG. 3). For example, the defrosting cavity may be defined by interior surfaces of bottom, side, front, and back walls of a drawer, and an interior top surface of a fixed shelf 216, 226 under which the drawer slides. With the drawer slid fully under the shelf, the drawer and shelf define the cavity as an enclosed air cavity. The components and functionalities of the defrosting systems 210, 220 may be substantially the same as the components and functionalities of defrosting system 100, in various embodiments.

In addition, according to an embodiment, each of the defrosting systems 210, 220 may have sufficient thermal communication with the freezer or refrigerator compartment 212, 222, respectively, in which the system 210, 220 is disposed. In such an embodiment, after completion of a defrosting operation, the load may be maintained at a safe temperature (i.e., a temperature at which food spoilage is retarded) until the load is removed from the system 210, 220. More specifically, upon completion of a defrosting operation by the freezer-based defrosting system 210, the cavity within which the defrosted load is contained may thermally communicate with the freezer compartment 212, and if the load is not promptly removed from the cavity, the load may re-freeze. Similarly, upon completion of a defrosting operation by the refrigerator-based defrosting system 220, the cavity within which the defrosted load is contained may thermally communicate with the refrigerator compartment 222, and if the load is not promptly removed from the cavity, the load may be maintained in a defrosted state at the temperature within the refrigerator compartment 222.

Those of skill in the art would understand, based on the description herein, that embodiments of defrosting systems may be incorporated into systems or appliances having other configurations, as well. Accordingly, the above-described implementations of defrosting systems in a stand-alone appliance, a microwave oven appliance, a freezer, and a refrigerator are not meant to limit use of the embodiments only to those types of systems.

Although defrosting systems 100, 200 are shown with their components in particular relative orientations with respect to one another, it should be understood that the various components may be oriented differently, as well. In addition, the physical configurations of the various components may be different. For example, control panels 120, 214, 224 may have more, fewer, or different user interface elements, and/or the user interface elements may be differently arranged. In addition, although a substantially cubic defrosting cavity 110 is illustrated in FIG. 1, it should be understood that a defrosting cavity may have a different shape, in other embodiments (e.g., cylindrical, and so on). Further, defrosting systems 100, 210, 220 may include additional components (e.g., a fan, a stationary or rotating plate, a tray, an electrical cord, and so on) that are not specifically depicted in FIGS. 1, 2.

FIG. 3 is a simplified block diagram of a defrosting system 300 (e.g., defrosting system 100, 210, 220, FIGS. 1, 2), in accordance with an example embodiment. Defrosting system 300 includes defrosting cavity 310, user interface 320, system controller 330, RF signal source 340, power supply and bias circuitry 350, variable impedance matching network 360, electrode 370, and power detection circuitry 380, in an embodiment. In addition, in other embodiments, defrosting system 300 may include temperature sensor(s), infrared (IR) sensor(s), and/or weight sensor(s) 390, although some or all of these sensor components may be excluded. It should be understood that FIG. 3 is a simplified representation of a defrosting system 300 for purposes of explanation and ease of description, and that practical embodiments may include other devices and components to provide additional functions and features, and/or the defrosting system 300 may be part of a larger electrical system.

User interface 320 may correspond to a control panel (e.g., control panel 120, 214, 224, FIGS. 1, 2), for example, which enables a user to provide inputs to the system regarding parameters for a defrosting operation (e.g., characteristics of the load to be defrosted, and so on), start and cancel buttons, mechanical controls (e.g., a door/drawer open latch), and so on. In addition, the user interface may be configured to provide user-perceptible outputs indicating the status of a defrosting operation (e.g., a countdown timer, visible indicia indicating progress or completion of the defrosting operation, and/or audible tones indicating completion of the defrosting operation) and other information.

System controller 330 may include one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, system controller 330 is coupled to user interface 320, RF signal source 340, variable impedance matching network 360, power detection circuitry 380, and sensors 390 (if included). System controller 330 is configured to receive signals indicating user inputs received via user interface 320, and to receive forward and reflected power measurements from power detection circuitry 380. Responsive to the received signals and measurements, and as will be described in more detail later, system controller 330 provides control signals to the power supply and bias circuitry 350 and to the RF signal generator 342 of the RF signal source 340. In addition, system controller 330 provides control signals to the variable impedance matching network 360, which cause the network 360 to change its state or configuration.

Defrosting cavity 310 includes a capacitive defrosting arrangement with first and second parallel plate electrodes that are separated by an air cavity within which a load 316 to be defrosted may be placed. For example, a first electrode 370 may be positioned above the air cavity, and a second electrode may be provided by a portion of a containment structure 312. More specifically, the containment structure 312 may include bottom, top, and side walls, the interior surfaces of which define the cavity 310 (e.g., cavity 110, FIG. 1). According to an embodiment, the cavity 310 may be sealed (e.g., with a door 116, FIG. 1 or by sliding a drawer closed under a shelf 216, 226, FIG. 2) to contain the electromagnetic energy that is introduced into the cavity 310 during a defrosting operation. The system 300 may include one or more interlock mechanisms that ensure that the seal is intact during a defrosting operation. If one or more of the interlock mechanisms indicates that the seal is breached, the system controller 330 may cease the defrosting operation. According to an embodiment, the containment structure 312 is at least partially formed from conductive material, and the conductive portion(s) of the containment structure may be grounded. Alternatively, at least the portion of the containment structure 312 that corresponds to the bottom surface of the cavity 310 may be formed from conductive material and grounded. Either way, the containment structure 312 (or at least the portion of the containment structure 312 that is parallel with the first electrode 370) functions as a second electrode of the capacitive defrosting arrangement. To avoid direct contact between the load 316 and the grounded bottom surface of the cavity 310, a non-conductive barrier 314 may be positioned over the bottom surface of the cavity 310.

Defrosting cavity 310 and any load 316 (e.g., food, liquids, and so on) positioned in the defrosting cavity 310 present a cumulative load for the electromagnetic energy (or RF power) that is radiated into the cavity 310 by the first electrode 370. More specifically, the cavity 310 and the load 316 present an impedance to the system, referred to herein as a "cavity input impedance." The cavity input impedance changes during a defrosting operation as the temperature of the load 316 increases. As will be described in conjunction with FIG. 10 later, the impedance of many types of food loads changes with respect to temperature in a somewhat predictable manner as the food load transitions from a frozen state to a defrosted state. According to an embodiment, based on reflected and forward power measurements from the power detection circuitry 380, the system controller 330 is configured to identify a point in time during a defrosting operation when the rate of change of cavity input impedance indicates that the load 316 is approaching 0° Celsius, at which time the system controller 330 may terminate the defrosting operation.

The first electrode 370 is electrically coupled to the RF signal source 340 through a variable impedance matching network 360 and a transmission path 348, in an embodiment. As will be described in more detail later, the variable impedance matching circuit 360 is configured to perform an impedance transformation from an impedance of the RF signal source 340 to an input impedance of defrosting cavity 340 as modified by the load 316. In an embodiment, the variable impedance matching network 360 includes a network of passive components (e.g., inductors, capacitors, resistors). According to a more specific embodiment, the variable impedance matching network 360 includes a plurality of fixed-value lumped inductors (e.g., inductors 412-414, 712-714, 812-814, FIGS. 4, 7, 8) that are positioned within the cavity 310 and which are electrically coupled to the first electrode 370. In addition, the variable impedance matching network 360 includes a plurality of variable inductance networks (e.g., networks 410, 411, 500, FIGS. 4, 5), which may be located inside or outside of the cavity 310. The inductance value provided by each of the variable inductance networks is established using control signals from the system controller 330, as will be described in more detail later. In any event, by changing the state of the variable impedance matching network 360 over the course of a defrosting operation to dynamically match the ever-changing cavity input impedance, the amount of RF power that is absorbed by the load 316 may be maintained at a high level despite variations in the load impedance during the defrosting operation.

According to an embodiment, RF signal source 350 includes an RF signal generator 342 and a power amplifier (e.g., including one or more power amplifier stages 344, 346). In response to control signals provided by system controller 330, RF signal generator 342 is configured to produce an oscillating electrical signal having a frequency in the ISM (industrial, scientific, and medical) band, although the system could be modified to support operations in other frequency bands, as well. The RF signal generator 342 may be controlled to produce oscillating signals of different power levels and/or different frequencies, in various embodiments. For example, the RF signal generator 342 may produce a signal that oscillates in a range of about 3.0 megahertz (MHz) to about 300 MHz. Some desirable frequencies may be, for example, 13.56 MHz (+/−5 percent), 27.125 MHz (+/−5 percent), and 40.68 MHz (+/−5 percent). In one particular embodiment, for example, the RF signal generator 342 may produce a signal that oscillates in a range of about 40.66 MHz to about 40.70 MHz and at a power level in a range of about 10 decibels (dB) to about 15 dB. Alternatively, the frequency of oscillation and/or the power level may be lower or higher.

In the embodiment of FIG. 3, the power amplifier includes a driver amplifier stage 344 and a final amplifier stage 346. The power amplifier is configured to receive the oscillating signal from the RF signal generator 342, and to amplify the signal to produce a significantly higher-power signal at an output of the power amplifier. For example, the output signal may have a power level in a range of about 100 watts to about 400 watts or more. The gain applied by the power amplifier may be controlled using gate bias voltages and/or drain supply voltages provided by the power supply and bias circuitry 350 to each amplifier stage 344, 346. More specifically, power supply and bias circuitry 350 provides bias and supply voltages to each RF amplifier stage 344, 346 in accordance with control signals received from system controller 330. In an embodiment, each amplifier stage 344, 346 is implemented as a power transistor, such as a field effect transistor (FET), having an input terminal (e.g., a gate or control terminal) and two current carrying terminals (e.g., source and drain terminals). Impedance matching circuits (not illustrated) may be coupled to the input (e.g., gate) of the driver amplifier stage 344, between the driver and final amplifier stages 346, and/or to the output (e.g., drain terminal) of the final amplifier stage 346, in various embodiments. In an embodiment, each transistor of the amplifier stages 344, 346 includes a laterally diffused metal oxide semiconductor FET (LDMOSFET) transistor. However, it should be noted that the transistors are not intended to be limited to any particular semiconductor technology, and in other embodiments, each transistor may be realized as a gallium nitride (GaN) transistor, another type of MOSFET transistor, a bipolar junction transistor (BJT), or a transistor utilizing another semiconductor technology.

In FIG. 3, the power amplifier arrangement is depicted to include two amplifier stages 344, 346 coupled in a particular manner to other circuit components. In other embodiments, the power amplifier arrangement may include other amplifier topologies and/or the amplifier arrangement may include only one amplifier stage, or more than two amplifier stages. For example, the power amplifier arrangement may include various embodiments of a single ended amplifier, a double ended amplifier, a push-pull amplifier, a Doherty amplifier, a Switch Mode Power Amplifier (SMPA), or another type of amplifier.

Power detection circuitry 380 is coupled along the transmission path 348 between the output of the RF signal source 340 and the input to the variable impedance matching network 360, in an embodiment. In an alternate embodiment, power detection circuitry 380 may be coupled to the transmission path 349 between the output of the variable impedance matching network 360 and the first electrode 370. Either way, power detection circuitry 380 is configured to monitor, measure, or otherwise detect the power of the forward signals (i.e., from RF signal source 340 toward first electrode 370) and the reflected signals (i.e., from first electrode 370 toward RF signal source 340) traveling along the transmission path 348.

Power detection circuitry 380 supplies signals conveying the magnitudes of the forward and reflected signal power to system controller 330. System controller 330, in turn, may calculate a ratio of reflected signal power to forward signal power, or the S11 parameter. As will be described in more detail below, when the reflected to forward power ratio exceeds a threshold, this indicates that the system 300 is not adequately matched, and that energy absorption by the load 316 may be sub-optimal. In such a situation, system controller 330 orchestrates a process of altering the state of the variable impedance matching network until the reflected to forward power ratio decreases to a desired level, thus re-establishing an acceptable match and facilitating more optimal energy absorption by the load 316.

As mentioned above, some embodiments of defrosting system 300 may include temperature sensor(s), IR sensor(s), and/or weight sensor(s) 390. The temperature sensor(s) and/or IR sensor(s) may be positioned in locations that enable the temperature of the load 316 to be sensed during the defrosting operation. When provided to the system controller 330, the temperature information enables the system controller 330 to alter the power of the RF signal supplied by the RF signal source 340 (e.g., by controlling the bias and/or supply voltages provided by the power supply and bias circuitry 350), to adjust the state of the variable impedance matching network 360, and/or to determine when the defrosting operation should be terminated. The weight sensor(s) are positioned under the load 316, and are configured to provide an estimate of the weight of the load 316 to the system controller 330. The system controller 330 may use this information, for example, to determine a desired power level for the RF signal supplied by the RF signal source 340, to determine an initial setting for the variable impedance matching network 360, and/or to determine an approximate duration for the defrosting operation.

As discussed above, the variable impedance matching network 360 is used to match the input impedance of the defrosting cavity 310 plus load 316 to maximize, to the extent possible, the RF power transfer into the load 316. The initial impedance of the defrosting cavity 310 and the load 316 may not be known with accuracy at the beginning of a defrosting operation. Further, the impedance of the load 316 changes during a defrosting operation as the load 316 warms up. According to an embodiment, the system controller 330 may provide control signals to the variable impedance matching network 360, which cause modifications to the state of the variable impedance matching network 360. This enables the system controller 330 to establish an initial state of the variable impedance matching network 360 at the beginning of the defrosting operation that has a relatively low reflected to forward power ratio, and thus a relatively high absorption of the RF power by the load 316. In addition, this enables the system controller 330 to modify the state of the variable impedance matching network 360 so that an adequate match may be maintained throughout the defrosting operation, despite changes in the impedance of the load 316.

According to an embodiment, the variable impedance matching network 360 may include a network of passive components, and more specifically a network of fixed-value inductors (e.g., lumped inductive components) and variable inductors (or variable inductance networks). As used herein, the term "inductor" means a discrete inductor or a set of inductive components that are electrically coupled together without intervening components of other types (e.g., resistors or capacitors).

Figure 4:
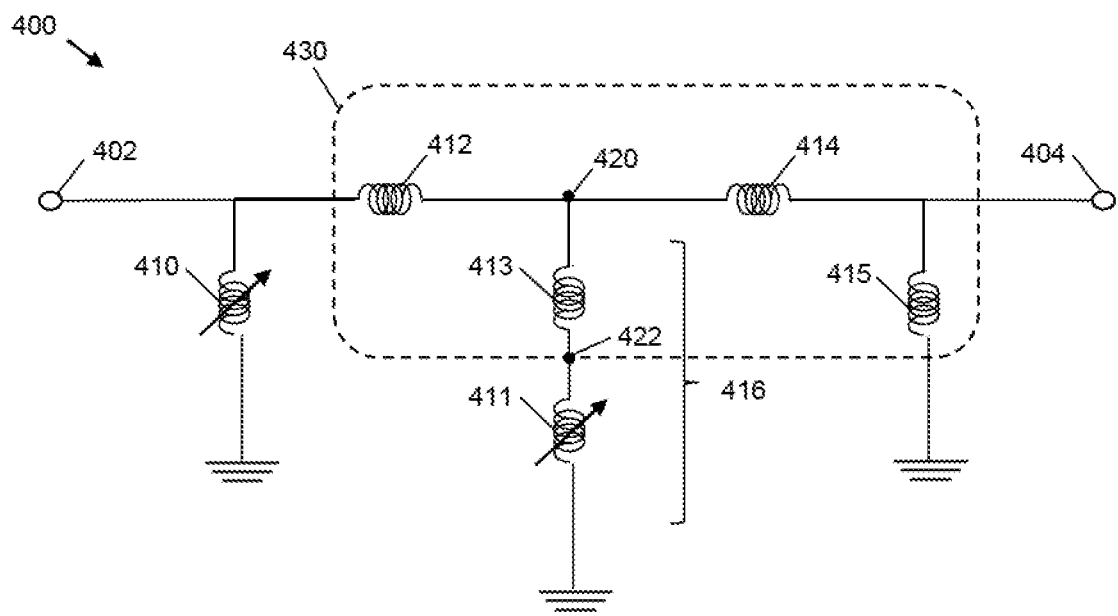
FIG. 4 is a schematic diagram of a variable inductance matching network, in accordance with an example embodiment.

FIG. 4 is a schematic diagram of a variable impedance matching network 400 (e.g., variable impedance matching network 360, FIG. 3), in accordance with an example embodiment. As will be explained in more detail below, the variable impedance matching network 360 essentially has two portions: one portion to match the RF signal source (or the final stage power amplifier); and another portion to match the cavity plus load.

Variable impedance matching network 400 includes an input node 402, an output node 404, first and second variable inductance networks 410, 411, and a plurality of fixed-value inductors 412-415, according to an embodiment. When incorporated into a defrosting system (e.g., system 300, FIG. 3), the input node 402 is electrically coupled to an output of the RF signal source (e.g., RF signal source 340, FIG. 3), and the output node 404 is electrically coupled to an electrode (e.g., first electrode 370, FIG. 3) within the defrosting cavity (e.g., defrosting cavity 310, FIG. 3).

Between the input and output nodes 402, 404, the variable impedance matching network 400 includes first and second, series coupled lumped inductors 412, 414, in an embodiment. The first and second lumped inductors 412, 414 are relatively large in both size and inductance value, in an embodiment, as they may be designed for relatively low frequency (e.g., about 4.66 MHz to about 4.68 MHz) and high power (e.g., about 50 watts (W) to about 500 W) operation. For example, inductors 412, 414 may have values in a range of about 200 nanohenries (nH) to about 600 nH, although their values may be lower and/or higher, in other embodiments.

The first variable inductance network 410 is a first shunt inductive network that is coupled between the input node 402 and a ground reference terminal (e.g., the grounded containment structure 312, FIG. 3). According to an embodiment, the first variable inductance network 410 is configurable to match the impedance of the RF signal source (e.g., RF signal source 340, FIG. 3), or more particularly to match the final stage power amplifier (e.g., amplifier 346, FIG. 3). Accordingly, the first variable inductance network 410 may be referred to as the "power amplifier matching portion" of the variable impedance matching network 400. According to an embodiment, and as will be described in more detail in conjunction with FIG. 5, the first variable inductance network 410 includes a network of inductive components that may be selectively coupled together to provide inductances in a range of about 20 nH to about 400 nH, although the range may extend to lower or higher inductance values, as well.

In contrast, the "cavity matching portion" of the variable impedance matching network 400 is provided by a second shunt inductive network 416 that is coupled between a node 422 between the first and second lumped inductors 412, 414 and the ground reference terminal. According to an embodiment, the second shunt inductive network 416 includes a third lumped inductor 413 and a second variable inductance network 411 coupled in series, with an intermediate node 422 between the third lumped inductor 413 and the second variable inductance network 411. Because the state of the second variable inductance network 411 may be changed to provide multiple inductance values, the second shunt inductive network 416 is configurable to optimally match the impedance of the cavity plus load (e.g., cavity 310 plus load 316, FIG. 3). For example, inductor 413 may have a value in a range of about 400 nH to about 800 nH, although its value may be lower and/or higher, in other embodiments. According to an embodiment, and as will be described in more detail in conjunction with FIG. 5, the second variable inductance network 411 includes a network of inductive components that may be selectively coupled together to provide inductances in a range of about 50 nH to about 800 nH, although the range may extend to lower or higher inductance values, as well.

Finally, the variable impedance matching network 400 includes a fourth lumped inductor 415 coupled between the output node 404 and the ground reference terminal. For example, inductor 415 may have a value in a range of about 400 nH to about 800 nH, although its value may be lower and/or higher, in other embodiments.

As will be described in more detail in conjunction with FIGS. 7 and 8, the set 430 of lumped inductors 412-415 may be physically located within the cavity (e.g., cavity 310, FIG. 3), or at least within the confines of the containment structure (e.g., containment structure 312, FIG. 3). This enables the radiation produced by the lumped inductors 412-415 to be safely contained within the system, rather than being radiated out into the surrounding environment. In contrast, the variable inductance networks 410, 411 may or may not be contained within the cavity or the containment structure, in various embodiments.

According to an embodiment, the variable impedance matching network 400 embodiment of FIG. 4 includes "only inductors" to provide a match for the input impedance of the defrosting cavity 310 plus load 316. Thus, the network 400 may be considered an "inductor-only" matching network. As used herein, the phrases "only inductors" or "inductor-only" when describing the components of the variable impedance matching network means that the network does not include discrete resistors with significant resistance values or discrete capacitors with significant capacitance values. In some cases, conductive transmission lines between components of the matching network may have minimal resistances, and/or minimal parasitic capacitances may be present within the network. Such minimal resistances and/or minimal parasitic capacitances are not to be construed as converting embodiments of the "inductor-only" network into a matching network that also includes resistors and/or capacitors. Those of skill in the art would understand, however, that other embodiments of variable impedance matching networks may include differently configured inductor-only matching networks, and matching networks that include combinations of discrete inductors, discrete capacitors, and/or discrete resistors. As will be described in more detail in conjunction with FIG. 6, an "inductor-only" matching network alternatively may be defined as a matching network that enables impedance matching of a capacitive load using solely or primarily inductive components.

Figure 5:
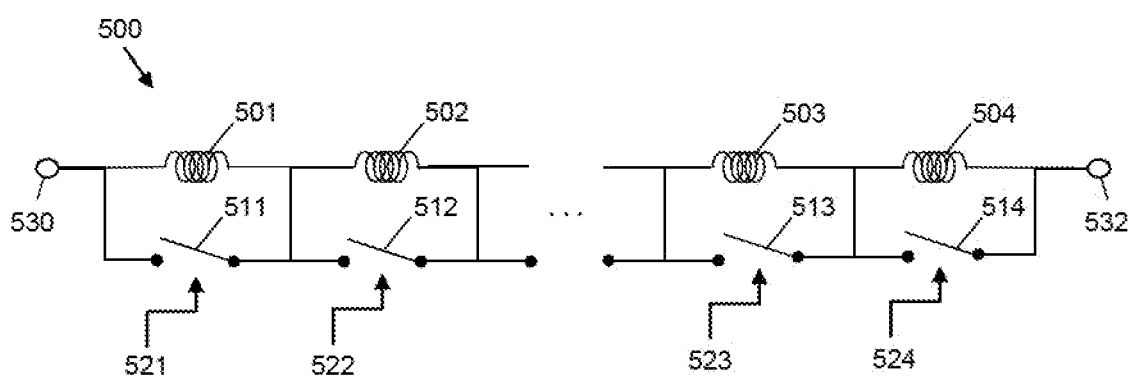
FIG. 5 is a schematic diagram of a variable inductance network, in accordance with an example embodiment.

FIG. 5 is a schematic diagram of a variable inductance network 500 that may be incorporated into a variable impedance matching network (e.g., as variable inductance networks 410 and/or 411, FIG. 4), in accordance with an example embodiment. Network 500 includes an input node 530, an output node 532, and a plurality, N, of discrete inductors 501-504 coupled in series with each other between the input and output nodes 530, 523, where N may be an integer between 2 and 10, or more. In addition, network 500 includes a plurality, N, of switches 511-514, where each switch 511-514 is coupled in parallel across the terminals of one of the inductors 501-504. Switches 511-514 may be implemented as transistors, mechanical relays or mechanical switches, for example. The electrically conductive state of each switch 511-514 (i.e., open or closed) is controlled using control signals 521-524 from the system controller (e.g., system controller 330, FIG. 3).

For each parallel inductor/switch combination, substantially all current flows through the inductor when its corresponding switch is in an open or non-conductive state, and substantially all current flows through the switch when the switch is in a closed or conductive state. For example, when all switches 511-514 are open, as illustrated in FIG. 5, substantially all current flowing between input and output nodes 530, 532 flows through the series of inductors 501-504. This configuration represents the maximum inductance state of the network 500 (i.e., the state of network 500 in which a maximum inductance value is present between input and output nodes 530, 532). Conversely, when all switches 511-514 are closed, substantially all current flowing between input and output nodes 530, 532 bypasses the inductors 501-504 and flows instead through the switches 511-514 and the conductive interconnections between nodes 530, 532 and switches 511-514. This configuration represents the minimum inductance state of the network 500 (i.e., the state of network 500 in which a minimum inductance value is present between input and output nodes 530, 532). Ideally, the minimum inductance value would be near zero inductance. However, in practice a "trace" inductance is present in the minimum inductance state due to the cumulative inductances of the switches 511-514 and the conductive interconnections between nodes 530, 532 and the switches 511-514. For example, in the minimum inductance state, the trace inductance for the variable inductance network 500 may be in a range of about 20 nH to about 50 nH, although the trace inductance may be smaller or larger, as well. Larger, smaller, or substantially similar trace inductances also may be inherent in each of the other network states, as well, where the trace inductance for any given network state is a summation of the inductances of the sequence of conductors and switches through which the current primarily is carried through the network 500.

Starting from the maximum inductance state in which all switches 511-514 are open, the system controller may provide control signals 521-524 that result in the closure of any combination of switches 511-514 in order to reduce the inductance of the network 500 by bypassing corresponding combinations of inductors 501-504. In one embodiment, each inductor 501-504 has substantially the same inductance value, referred to herein as a normalized value of I. For example, each inductor 501-504 may have a value in a range of about 100 nH to about 200 nH, or some other value. In such an embodiment, the maximum inductance value for the network 500 (i.e., when all switches 511-514 are in an open state) would be about N×I, plus any trace inductance that may be present in the network 500 when it is in the maximum inductance state. When any n switches are in a closed state, the inductance value for the network 500 would be about (N−n)×I (plus trace inductance). In such an embodiment, the state of the network 500 may be configured to have any of N+1 values of inductance.

In an alternate embodiment, the inductors 501-504 may have different values from each other. For example, moving from the input node 530 toward the output node 532, the first inductor 501 may have a normalized inductance value of I, and each subsequent inductor 502-504 in the series may have a larger or smaller inductance value. For example, each subsequent inductor 502-504 may have an inductance value that is a multiple (e.g., about twice) the inductance value of the nearest downstream inductor 501-503, although the difference may not necessarily be an integer multiple. In such an embodiment, the state of the network 500 may be configured to have any of $2^N$ values of inductance. For example, when N=4 and each inductor 501-504 has a different value, the network 500 may be configured to have any of 16 values of inductance. For example but not by way of limitation, assuming that inductor 501 has a value of I, inductor 502 has a value of 2×I, inductor 503 has a value of 4×I, and inductor 504 has a value of 8×I, Table 1, below indicates the total inductance value for all 16 possible states of the network 500 (not accounting for trace inductances):

TABLE 1

Total inductance values for all possible variable inductance network states

| Network state | Switch 511 state (501 value = I) | Switch 512 state (502 value = 2 × I) | Switch 513 state (503 value = 4 × I) | Switch 514 state (504 value = 8 × I) | Total network inductance (w/o trace inductance) |
| --- | --- | --- | --- | --- | --- |
| 0 | closed | closed | closed | closed | 0 |
| 1 | open | closed | closed | closed | I |
| 2 | closed | open | closed | closed | 2 × I |
| 3 | open | open | closed | closed | 3 × I |
| 4 | closed | closed | open | closed | 4 × I |
| 5 | open | closed | open | closed | 5 × I |
| 6 | closed | open | open | closed | 6 × I |
| 7 | open | open | open | closed | 7 × I |
| 8 | closed | closed | closed | open | 8 × I |
| 9 | open | closed | closed | open | 9 × I |

TABLE 1-continued

Total inductance values for all possible variable inductance network states

| Network state | Switch 511 state (501 value = I) | Switch 512 state (502 value = 2 × I) | Switch 513 state (503 value = 4 × I) | Switch 514 state (504 value = 8 × I) | Total network inductance (w/o trace inductance) |
|---|---|---|---|---|---|
| 10 | closed | open   | closed | open | 10 × I |
| 11 | open   | open   | closed | open | 11 × I |
| 12 | closed | closed | open   | open | 12 × I |
| 13 | open   | closed | open   | open | 13 × I |
| 14 | closed | open   | open   | open | 14 × I |
| 15 | open   | open   | open   | open | 15 × I |

Referring again to FIG. 4, an embodiment of variable inductance network 410 may be implemented in the form of variable inductance network 500 with the above-described example characteristics (i.e., N=4 and each successive inductor is about twice the inductance of the preceding inductor). Assuming that the trace inductance in the minimum inductance state is about 20 nH, and the range of inductance values achievable by network 410 is about 20 nH (trace inductance) to about 400 nH, the values of inductors 501-504 may be, for example, about 30 nH, about 50 nH, about 100 nH, and about 200 nH, respectively. Similarly, if an embodiment of variable inductance network 411 is implemented in the same manner, and assuming that the trace inductance is about 50 nH and the range of inductance values achievable by network 411 is about 50 nH (trace inductance) to about 800 nH, the values of inductors 501-504 may be, for example, about 50 nH, about 100 nH, about 200 nH, and about 400 nH, respectively. Of course, more or fewer than four inductors 501-504 may be included in either variable inductance network 410, 411, and the inductors within each network 410, 411 may have different values.

Although the above example embodiment specifies that the number of switched inductances in the network 500 equals four, and that each inductor 501-504 has a value that is some multiple of a value of I, alternate embodiments of variable inductance networks may have more or fewer than four inductors, different relative values for the inductors, a different number of possible network states, and/or a different configuration of inductors (e.g., differently connected sets of parallel and/or series coupled inductors). Either way, by providing a variable inductance network in an impedance matching network of a defrosting system, the system may be better able to match the ever-changing cavity input impedance that is present during a defrosting operation.

Figure 6:
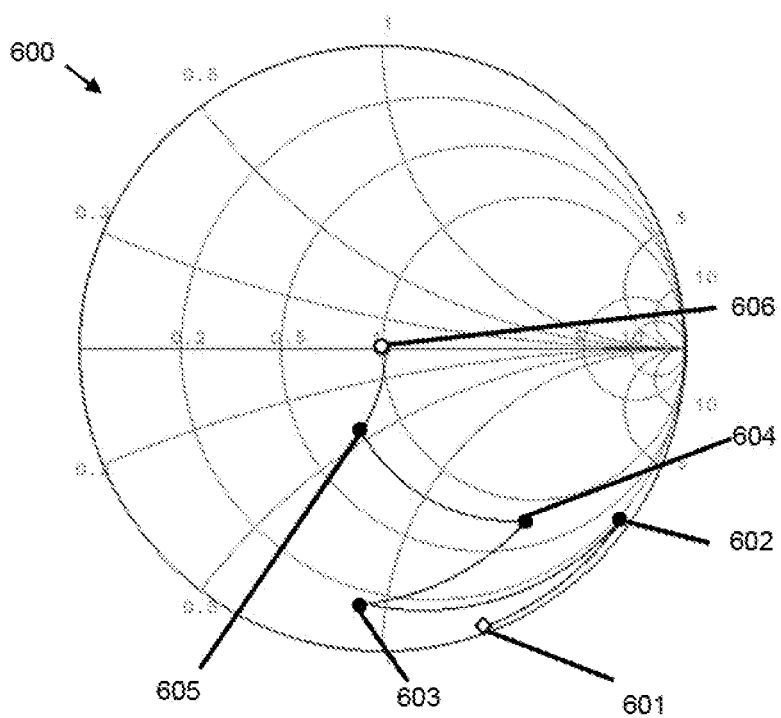
FIG. 6 is an example of a Smith chart depicting how a plurality of inductances in an embodiment of a variable impedance matching network may match the input cavity impedance to an RF signal source.

FIG. 6 is an example of a Smith chart 600 depicting how the plurality of inductances in an embodiment of a variable impedance matching network (e.g., network 360, 400, FIGS. 3, 4) may match the input cavity impedance to the RF signal source. The example Smith chart 600 assumes that the system is a 50 Ohm system, and that the output of the RF signal source is 50 Ohms. Those of skill in the art would understand, based on the description herein, how the Smith chart could be modified for a system and/or RF signal source with different characteristic impedances.

In Smith chart 600, point 601 corresponds to the point at which the load (e.g., the cavity 310 plus load 316, FIG. 3) would locate (e.g., at the beginning of a defrosting operation) absent the matching provided by the variable impedance matching network (e.g., network 360, 400, FIGS. 3, 4). As indicated by the position of the load point 601 in the lower right quadrant of the Smith chart 600, the load is a capacitive load. According to an embodiment, the shunt and series inductances of the variable impedance matching network sequentially move the substantially-capacitive load impedance toward an optimal matching point 606 (e.g., 50 Ohms) at which RF energy transfer to the load may occur with minimal losses. More specifically, and referring also to FIG. 4, shunt inductance 415 moves the impedance to point 602, series inductance 414 moves the impedance to point 603, shunt inductance 416 moves the impedance to point 604, series inductance 412 moves the impedance to point 605, and shunt inductance 410 moves the impedance to the optimal matching point 606.

It should be noted that the combination of impedance transformations provided by embodiments of the variable impedance matching network keep the impedance at any point within or very close to the lower right quadrant of the Smith chart 600. As this quadrant of the Smith chart 600 is characterized by relatively high impedances and relatively low currents, the impedance transformation is achieved without exposing components of the circuit to relatively high and potentially damaging currents. Accordingly, an alternate definition of an "inductor-only" matching network, as used herein, may be a matching network that enables impedance matching of a capacitive load using solely or primarily inductive components, where the impedance matching network performs the transformation substantially within the lower right quadrant of the Smith chart.

As discussed previously, the impedance of the load changes during the defrosting operation. Accordingly, point 601 correspondingly moves during the defrosting operation. Movement of load point 601 is compensated for, according to the previously-described embodiments, by varying the impedance of the first and second shunt inductances 410, 411 so that the final match provided by the variable impedance matching network still may arrive at or near the optimal matching point 606. Although a specific variable impedance matching network has been illustrated and described herein, those of skill in the art would understand, based on the description herein, that differently-configured variable impedance matching networks may achieve the same or similar results to those conveyed by Smith chart 600. For example, alternative embodiments of a variable impedance matching network may have more or fewer shunt and/or series inductances, and or different ones of the inductances may be configured as variable inductance networks (e.g., including one or more of the series inductances). Accordingly, although a particular variable inductance matching network has been illustrated and described herein, the inventive subject matter is not limited to the illustrated and described embodiment.

A particular physical configuration of a defrosting system will now be described in conjunction with FIGS. 7 and 8. More particularly, FIG. 7 is a cross-sectional, side view of a defrosting system 700, in accordance with an example embodiment, and FIG. 8 is a perspective view of a portion of defrosting system 700. The defrosting system 700 generally includes a defrosting cavity 774, a user interface (not shown), a system controller 730, an RF signal source 740, a power supply and bias circuitry (not shown), power detection circuitry 780, a variable impedance matching network 760, a first electrode 770, and a second electrode 772, in an embodiment. In addition, in some embodiments, defrosting system 700 may include weight sensor(s) 790, temperature sensor(s), and/or IR sensor(s) 792.

The defrosting system 700 is contained within a containment structure 750, in an embodiment. According to an embodiment, the containment structure 750 may define three interior areas: the defrosting cavity 774, a fixed inductor area 776, and a circuit housing area 778. The containment structure 750 includes bottom, top, and side walls. Portions of the interior surfaces of some of the walls of the containment structure 750 may define the defrosting cavity 774. The defrosting cavity 774 includes a capacitive defrosting arrangement with first and second parallel plate electrodes 770, 772 that are separated by an air cavity within which a load 716 to be defrosted may be placed. For example, the first electrode 770 may be positioned above the air cavity, and a second electrode 772 may be provided by a conductive portion of the containment structure 750 (e.g., a portion of the bottom wall of the containment structure 750). Alternatively, the second electrode 772 may be formed from a conductive plate that is distinct from the containment structure 750. According to an embodiment, non-electrically conductive support structure(s) 754 may be employed to suspend the first electrode 770 above the air cavity, to electrically isolate the first electrode 770 from the containment structure 750, and to hold the first electrode 770 in a fixed physical orientation with respect to the air cavity.

According to an embodiment, the containment structure 750 is at least partially formed from conductive material, and the conductive portion(s) of the containment structure may be grounded to provide a ground reference for various electrical components of the system. Alternatively, at least the portion of the containment structure 750 that corresponds to the second electrode 772 may be formed from conductive material and grounded. To avoid direct contact between the load 716 and the second electrode 772, a non-conductive barrier 756 may be positioned over the second electrode 772.

When included in the system 700, the weight sensor(s) 790 are positioned under the load 716. The weight sensor(s) 790 are configured to provide an estimate of the weight of the load 716 to the system controller 730. The temperature sensor(s) and/or IR sensor(s) 792 may be positioned in locations that enable the temperature of the load 716 to be sensed both before, during, and after a defrosting operation. According to an embodiment, the temperature sensor(s) and/or IR sensor(s) 792 are configured to provide load temperature estimates to the system controller 730.

Some or all of the various components of the system controller 730, the RF signal source 740, the power supply and bias circuitry (not shown), the power detection circuitry 780, and portions 710, 711 of the variable impedance matching network 760, may be coupled to a common substrate 752 within the circuit housing area 778 of the containment structure 750, in an embodiment. According to an embodiment, the system controller 730 is coupled to the user interface, RF signal source 740, variable impedance matching network 760, and power detection circuitry 780 through various conductive interconnects on or within the common substrate 752. In addition, the power detection circuitry 780 is coupled along the transmission path 748 between the output of the RF signal source 740 and the input 702 to the variable impedance matching network 760, in an embodiment. For example, the substrate 752 may include a microwave or RF laminate, a polytetrafluoroethylene (PTFE) substrate, a printed circuit board (PCB) material substrate (e.g., FR-4), an alumina substrate, a ceramic tile, or another type of substrate. In various alternate embodiments, various ones of the components may be coupled to different substrates with electrical interconnections between the substrates and components. In still other alternate embodiments, some or all of the components may be coupled to a cavity wall, rather than being coupled to a distinct substrate.

The first electrode 770 is electrically coupled to the RF signal source 740 through a variable impedance matching network 760 and a transmission path 748, in an embodiment. As discussed previously, the variable impedance matching network 760 includes variable inductance networks 710, 711 (e.g., networks 410, 411, FIG. 4) and a plurality of fixed-value lumped inductors 712-715 (e.g., inductors 412-415, FIG. 4). In an embodiment, the variable inductance networks 710, 711 are coupled to the common substrate 752 and located within the circuit housing area 778. In contrast, the fixed-value lumped inductors 712-715 are positioned within the fixed inductor area 776 of the containment structure 750 (e.g., between the common substrate 752 and the first electrode 770). Conductive structures (e.g., conductive vias or other structures) may provide for electrical communication between the circuitry within the circuit housing area 778 and the lumped inductors 712-715 within the fixed inductor area 776.

Figure 7:
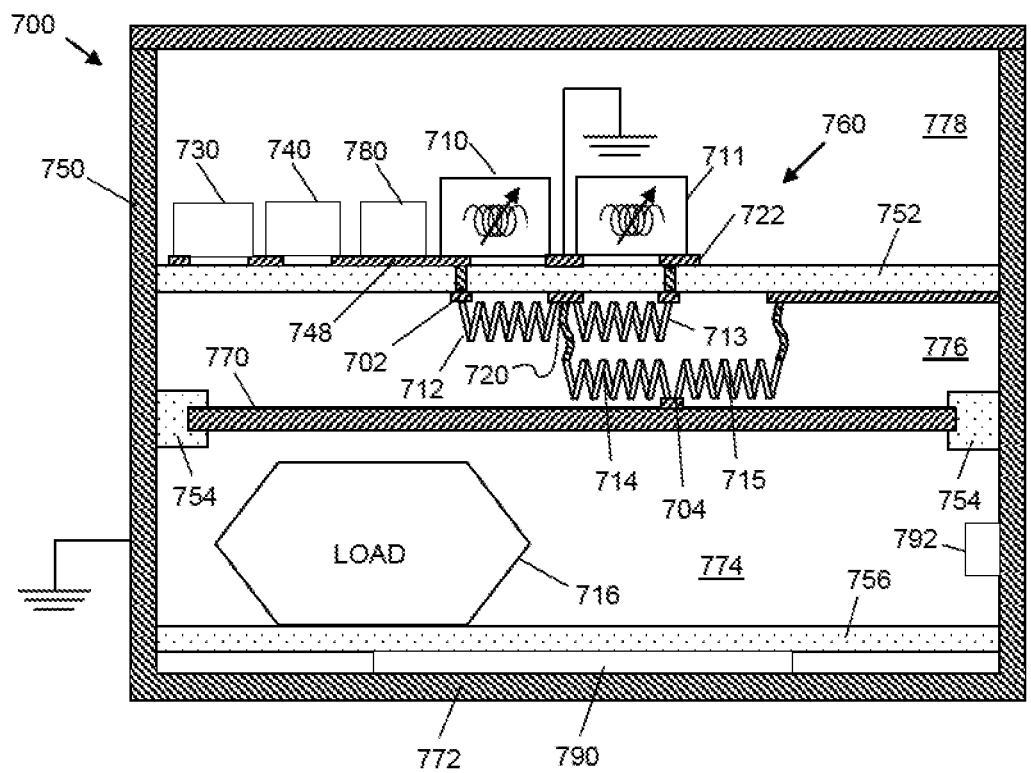
FIG. 7 is a cross-sectional, side view of a defrosting system, in accordance with an example embodiment.
Figure 8:
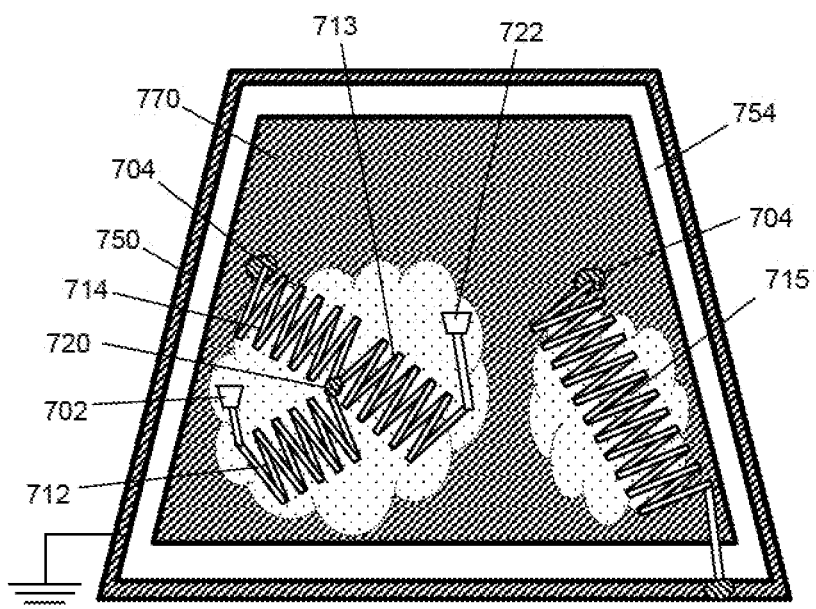
FIG. 8 is a perspective view of a portion of a defrosting system, in accordance with an example embodiment.

For enhanced understanding of the system 700, the nodes and components of the variable impedance matching network 760 depicted in FIGS. 7 and 8 will now be correlated with nodes and components of the variable impedance matching network 400 depicted in FIG. 4. More specifically, the variable impedance matching network 760 includes an input node 702 (e.g., input node 402, FIG. 4), an output node 704 (e.g., output node 404, FIG. 4), first and second variable inductance networks 710, 711 (e.g., variable inductance networks 410, 411, FIG. 4), and a plurality of fixed-value inductors 712-715 (e.g., inductors 412-415, FIG. 4), according to an embodiment. The input node 702 is electrically coupled to an output of the RF signal source 740 through various conductive structures (e.g., conductive vias and traces), and the output node 704 is electrically coupled to the first electrode 770.

Between the input and output nodes 702, 704 (e.g., input and output nodes 402, 404, FIG. 4), the variable impedance matching network 700 includes four lumped inductors 712-715 (e.g., inductors 412-415, FIG. 4), in an embodiment, which are positioned within the fixed inductor area 776. An enhanced understanding of an embodiment of a physical configuration of the lumped inductors 712-715 within the fixed inductor area 776 may be achieved by referring to both FIG. 7 and to FIG. 8 simultaneously, where FIG. 8 depicts a top perspective view of the fixed inductor area 776. In FIG. 8, the irregularly shaped, shaded areas underlying inductors 712-715 represents suspension of the inductors 712-715 in space over the first electrode 770. In other words, the shaded areas indicate where the inductors 712-715 are electrically insulated from the first electrode 770 by air. Rather than relying on an air dielectric, non-electrically conductive spacers may be included in these areas.

In an embodiment, the first lumped inductor 712 has a first terminal that is electrically coupled to the input node 702

(and thus to the output of RF signal source 740), and a second terminal that is electrically coupled to a first intermediate node 720 (e.g., node 420, FIG. 4). The second lumped inductor 713 has a first terminal that is electrically coupled to the first intermediate node 720, and a second terminal that is electrically coupled to a second intermediate node 722 (e.g., node 422, FIG. 4). The third lumped inductor 714 has a first terminal that is electrically coupled to the first intermediate node 720, and a second terminal that is electrically coupled to the output node 704 (and thus to the first electrode 770). The fourth lumped inductor 715 has a first terminal that is electrically coupled to the output node 704 (and thus to the first electrode 770), and a second terminal that is electrically coupled to a ground reference node (e.g., to the grounded containment structure 750 through one or more conductive interconnects).

The first variable inductance network 710 (e.g., network 410, FIG. 4) is electrically coupled between the input node 702 and a ground reference terminal (e.g., the grounded containment structure 750). Finally, the second shunt inductive network 716 is electrically coupled between the second intermediate node 722 and the ground reference terminal.

Figure 9:
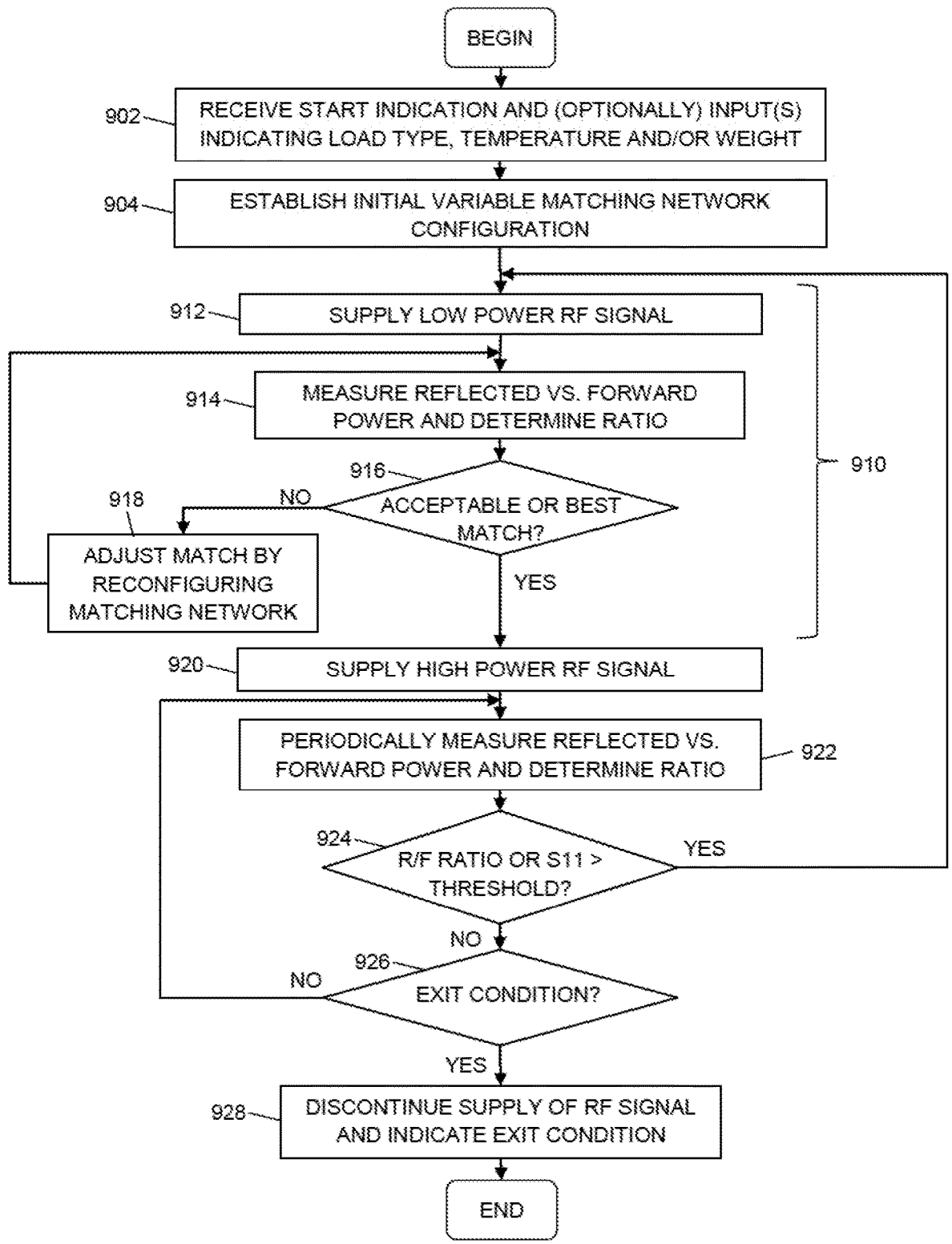
FIG. 9 is a flowchart of a method of operating a defrosting system with dynamic load matching, in accordance with an example embodiment.
Figure 10:
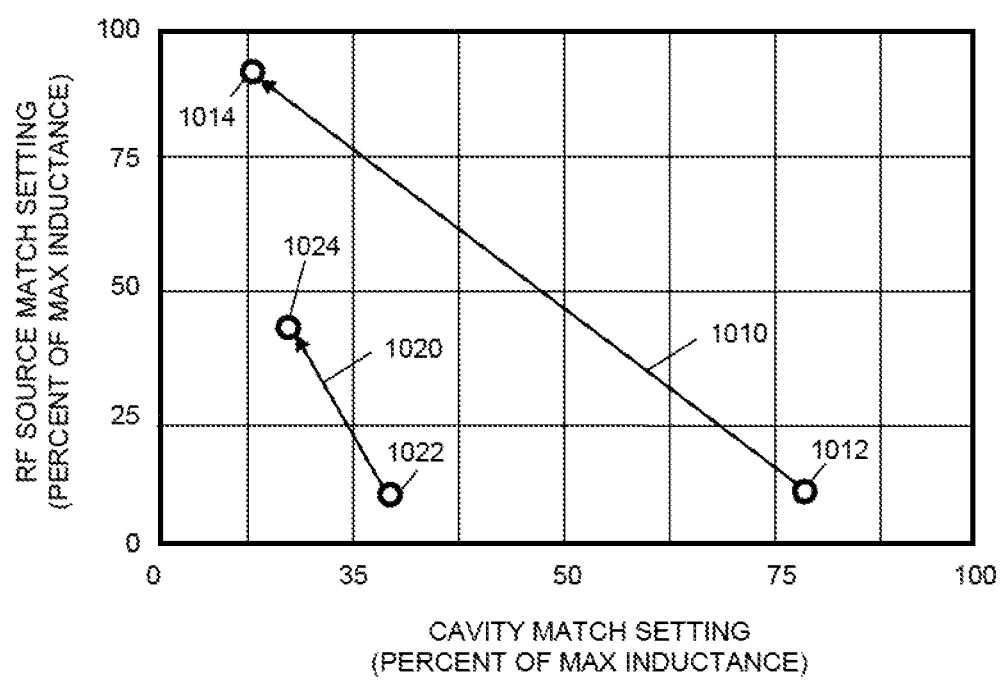
FIG. 10 is a chart plotting cavity match setting versus RF signal source match setting through a defrost operation for two different loads.

Now that embodiments of the electrical and physical aspects of defrosting systems have been described, various embodiments of methods for operating such defrosting systems will now be described in conjunction with FIGS. 9 and 10. More specifically, FIG. 9 is a flowchart of a method of operating a defrosting system (e.g., system 100, 210, 220, 300, 700, FIGS. 1-3, 7) with dynamic load matching, in accordance with an example embodiment.

The method may begin, in block 902, when the system controller (e.g., system controller 330, FIG. 3) receives an indication that a defrosting operation should start. Such an indication may be received, for example, after a user has place a load (e.g., load 316, FIG. 3) into the system's defrosting cavity (e.g., cavity 310, FIG. 3), has sealed the cavity (e.g., by closing a door or drawer), and has pressed a start button (e.g., of the user interface 320, FIG. 3). In an embodiment, sealing of the cavity may engage one or more safety interlock mechanisms, which when engaged, indicate that RF power supplied to the cavity will not substantially leak into the environment outside of the cavity. As will be described later, disengagement of a safety interlock mechanism may cause the system controller immediately to pause or terminate the defrosting operation.

According to various embodiments, the system controller optionally may receive additional inputs indicating the load type (e.g., meats, liquids, or other materials), the initial load temperature, and/or the load weight. For example, information regarding the load type may be received from the user through interaction with the user interface (e.g., by the user selecting from a list of recognized load types). Alternatively, the system may be configured to scan a barcode visible on the exterior of the load, or to receive an electronic signal from an RFID device on or embedded within the load. Information regarding the initial load temperature may be received, for example, from one or more temperature sensors and/or IR sensors (e.g., sensors 390, 792, FIGS. 3, 7) of the system. Information regarding the load weight may be received from the user through interaction with the user interface, or from a weight sensor (e.g., sensor 390, 790, FIGS. 3, 7) of the system. As indicated above, receipt of inputs indicating the load type, initial load temperature, and/or load weight is optional, and the system alternatively may not receive some or all of these inputs.

In block 904, the system controller provides control signals to the variable matching network (e.g., network 360, 400, FIGS. 3, 4) to establish an initial configuration or state for the variable matching network. As described in detail in conjunction with FIGS. 4 and 5, the control signals affect the inductances of variable inductance networks (e.g., networks 410, 411, FIG. 4) within the variable matching network. For example, the control signals may affect the states of bypass switches (e.g., switches 511-514, FIG. 5), which are responsive to the control signals from the system controller (e.g., control signals 521-524, FIG. 5).

As also discussed previously, a first portion of the variable matching network may be configured to provide a match for the RF signal source (e.g., RF signal source 340, FIG. 3) or the final stage power amplifier (e.g., power amplifier 346, FIG. 3), and a second portion of the variable matching network may be configured to provide a match for the cavity (e.g., cavity 310, FIG. 3) plus the load (e.g., load 316, FIG. 3). For example, referring to FIG. 4, a first shunt, variable inductance network 410 may be configured to provide the RF signal source match, and a second shunt, variable inductance network 416 may be configured to provide the cavity plus load match.

It has been observed that a best initial overall match for a frozen load (i.e., a match at which a maximum amount of RF power is absorbed by the load) typically has a relatively high inductance for the cavity matching portion of the matching network, and a relatively low inductance for the RF signal source matching portion of the matching network. For example, FIG. 10 is a chart plotting optimal cavity match setting versus RF signal source match setting through a defrost operation for two different loads, where trace 1010 corresponds to a first load (e.g., having a first type, weight, and so on), and trace 1020 corresponds to a second load (e.g., having a second type, weight, and so on). In FIG. 10, the optimal initial match settings for the two loads at the beginning of a defrost operation (e.g., when the loads are frozen) are indicated by points 1012 and 1022, respectively. As can be seen, both points 1012 and 1022 indicate relatively high cavity match settings in comparison to relatively low RF source match settings. Referring to the embodiment of FIG. 4, this translates to a relatively high inductance for variable inductance network 416, and a relatively low inductance for variable inductance network 410.

According to an embodiment, to establish the initial configuration or state for the variable matching network in block 904, the system controller sends control signals to the first and second variable inductance networks (e.g., networks 410, 411, FIG. 4) to cause the variable inductance network for the RF signal source match (e.g., network 410) to have a relatively low inductance, and to cause the variable inductance network for the cavity match (e.g., network 411) to have a relatively high inductance. The system controller may determine how low or how high the inductances are set based on load type/weight/temperature information known to the system controller a priori. If no a priori load type/weight/temperature information is available to the system controller, the system controller may select a relatively low default inductance for the RF signal source match and a relatively high default inductance for the cavity match.

Assuming, however, that the system controller does have a priori information regarding the load characteristics, the system controller may attempt to establish an initial configuration near the optimal initial matching point. For example, and referring again to FIG. 10, the optimal initial matching point 1012 for the first type of load has a cavity match (e.g., implemented by network 411) of about 80 percent of the network's maximum value, and has an RF signal source match (e.g., implemented by network 410) of about 10 percent of the network's maximum value. Assuming each of the variable inductance networks has a structure similar to the network 500 of FIG. 5, for example, and assuming that the states from Table 1, above, apply, then for the first type of load, system controller may initialize the variable inductance network so that the cavity match network (e.g., network 411) has state 12 (i.e., about 80 percent of the maximum possible inductance of network 411), and the RF signal source match network (e.g., network 410) has state 2 (i.e., about 10 percent of the maximum possible inductance of network 410). Conversely, the optimal initial matching point 1022 for the second type of load has a cavity match (e.g., implemented by network 411) of about 40 percent of the network's maximum value, and has an RF signal source match (e.g., implemented by network 410) of about 10 percent of the network's maximum value. Accordingly, for the second type of load, system controller may initialize the variable inductance network so that the cavity match network (e.g., network 411) has state 6 (i.e., about 40 percent of the maximum possible inductance of network 411), and the RF signal source match network (e.g., network 410) has state 2 (i.e., about 10 percent of the maximum possible inductance of network 410).

Referring again to FIG. 9, once the initial variable matching network configuration is established, the system controller may perform a process 910 of adjusting, if necessary, the configuration of the variable impedance matching network to find an acceptable or best match based on actual measurements that are indicative of the quality of the match. According to an embodiment, this process includes causing the RF signal source (e.g., RF signal source 340) to supply a relatively low power RF signal through the variable impedance matching network to the first electrode (e.g., first electrode 370), in block 912. The system controller may control the RF signal power level through control signals to the power supply and bias circuitry (e.g., circuitry 350, FIG. 3), where the control signals cause the power supply and bias circuitry to provide supply and bias voltages to the amplifiers (e.g., amplifier stages 344, 346, FIG. 3) that are consistent with the desired signal power level. For example, the relatively low power RF signal may be a signal having a power level in a range of about 10 W to about 20 W, although different power levels alternatively may be used. A relatively low power level signal during the match adjustment process 910 is desirable to reduce the risk of damaging the cavity or load (e.g., if the initial match causes high reflected power), and to reduce the risk of damaging the switching components of the variable inductance networks (e.g., due to arcing across the switch contacts).

In block 914, power detection circuitry (e.g., power detection circuitry 380, FIG. 3) then measures the forward and reflected power along the transmission path (e.g., path 348, FIG. 3) between the RF signal source and the first electrode, and provides those measurements to the system controller. The system controller may then determine a ratio between the reflected and forward signal powers, and may determine the S11 parameter for the system based on the ratio. The system controller may store the calculated ratios and/or S11 parameters for future evaluation or comparison, in an embodiment.

In block 916, the system controller may determine, based on the reflected-to-forward signal power ratio and/or the S11 parameter, whether or not the match provided by the variable impedance matching network is acceptable (e.g., the ratio is 10 percent or less, or compares favorably with some other criteria). Alternatively, the system controller may be configured to determine whether the match is the "best" match. A "best" match may be determined, for example, by iteratively measuring the forward and reflected RF power for all possible impedance matching network configurations (or at least for a defined subset of impedance matching network configurations), and determining which configuration results in the lowest reflected-to-forward power ratio.

When the system controller determines that the match is not acceptable or is not the best match, the system controller may adjust the match, in block 918, by reconfiguring the variable inductance matching network. For example, this may be achieved by sending control signals to the variable impedance matching network, which cause the network to increase and/or decrease the variable inductances within the network (e.g., by causing the variable inductance networks 410, 411 to have different inductance states). After reconfiguring the variable inductance network, blocks 914, 916, and 918 may be iteratively performed until an acceptable or best match is determined in block 916.

Once an acceptable or best match is determined, the defrosting operation may commence. Commencement of the defrosting operation includes increasing the power of the RF signal supplied by the RF signal source (e.g., RF signal source 340) to a relatively high power RF signal, in block 920. Once again, the system controller may control the RF signal power level through control signals to the power supply and bias circuitry (e.g., circuitry 350, FIG. 3), where the control signals cause the power supply and bias circuitry to provide supply and bias voltages to the amplifiers (e.g., amplifier stages 344, 346, FIG. 3) that are consistent with the desired signal power level. For example, the relatively high power RF signal may be a signal having a power level in a range of about 50 W to about 500 W, although different power levels alternatively may be used.

In block 922, power detection circuitry (e.g., power detection circuitry 380, FIG. 3) then periodically measures the forward and reflected power along the transmission path (e.g., path 348, FIG. 3) between the RF signal source and the first electrode, and provides those measurements to the system controller. The system controller again may determine a ratio between the reflected and forward signal powers, and may determine the S11 parameter for the system based on the ratio. The system controller may store the calculated ratios and/or S11 parameters for future evaluation or comparison, in an embodiment. According to an embodiment, the periodic measurements of the forward and reflected power may be taken at a fairly high frequency (e.g., on the order of milliseconds) or at a fairly low frequency (e.g., on the order of seconds). For example, a fairly low frequency for taking the periodic measurements may be a rate of one measurement every 10 seconds to 20 seconds.

In block 924, the system controller may determine, based on one or more calculated reflected-to-forward signal power ratios and/or one or more calculated S11 parameters, whether or not the match provided by the variable impedance matching network is acceptable. For example, the system controller may use a single calculated reflected-to-forward signal power ratio or S11 parameter in making this determination, or may take an average (or other calculation) of a number of previously-calculated reflected-to-forward power ratios or S11 parameters in making this determination. To determine whether or not the match is acceptable, the system controller may compare the calculated ratio and/or S11 parameter to a threshold, for example. For example, in one embodiment, the system controller may compare the calculated reflected-to-forward signal power ratio to a threshold of 10 percent (or some other value). A ratio below 10 percent may indicate that the match remains acceptable, and a ratio above 10 percent may indicate that the match is no longer acceptable. When the calculated ratio or S11 parameter is greater than the threshold (i.e., the comparison is unfavorable), indicating an unacceptable match, then the system controller may initiate re-configuration of the variable impedance matching network by again performing process 910.

As discussed previously, the match provided by the variable impedance matching network may degrade over the course of a defrosting operation due to impedance changes of the load (e.g., load 316, FIG. 3) as the load warms up. It has been observed that, over the course of a defrosting operation, an optimal cavity match may be maintained by decreasing the cavity match inductance (e.g., by decreasing the inductance of variable inductance network 411, FIG. 4) and by increasing the RF signal source inductance (e.g., by increasing the inductance of variable inductance network 410, FIG. 4). Referring again to FIG. 10, for example, an optimal match for the first type of load at the end of a defrosting operation is indicated by point 1014, and an optimal match for the second type of load at the end of a defrosting operation is indicated by point 1024. In both cases, tracking of the optimal match between initiation and completion of the defrosting operations involves gradually decreasing the inductance of the cavity match and increasing the inductance of the RF signal source match.

According to an embodiment, in the iterative process 910 of re-configuring the variable impedance matching network, the system controller may take into consideration this tendency. More particularly, when adjusting the match by reconfiguring the variable impedance matching network in block 918, the system controller initially may select states of the variable inductance networks for the cavity and RF signal source matches that correspond to lower inductances (for the cavity match, or network 411, FIG. 4) and higher inductances (for the RF signal source match, or network 410, FIG. 4). By selecting impedances that tend to follow the expected optimal match trajectories (e.g., those illustrated in FIG. 10), the time to perform the variable impedance matching network reconfiguration process 910 may be reduced, when compared with a reconfiguration process that does not take these tendencies into account.

In an alternate embodiment, the system controller may instead iteratively test each adjacent configuration to attempt to determine an acceptable configuration. For example, referring again to Table 1, above, if the current configuration corresponds to state 12 for the cavity matching network and to state 3 for the RF signal source matching network, the system controller may test states 11 and/or 13 for the cavity matching network, and may test states 2 and/or 4 for the RF signal source matching network. If those tests do not yield a favorable result (i.e., an acceptable match), the system controller may test states 10 and/or 14 for the cavity matching network, and may test states 1 and/or 5 for the RF signal source matching network, and so on.

In actuality, there are a variety of different searching methods that the system controller may employ to re-configure the system to have an acceptable impedance match, including testing all possible variable impedance matching network configurations. Any reasonable method of searching for an acceptable configuration is considered to fall within the scope of the inventive subject matter. In any event, once an acceptable match is determined in block 916, the defrosting operation is resumed in block 920, and the process continues to iterate.

Referring back to block 924, when the system controller determines, based on one or more calculated reflected-to-forward signal power ratios and/or one or more calculated S11 parameters, that the match provided by the variable impedance matching network is still acceptable (e.g., the calculated ratio or S11 parameter is less than the threshold, or the comparison is favorable), the system may evaluate whether or not an exit condition has occurred, in block 926. In actuality, determination of whether an exit condition has occurred may be an interrupt driven process that may occur at any point during the defrosting process. However, for the purposes of including it in the flowchart of FIG. 9, the process is shown to occur after block 924.

In any event, several conditions may warrant cessation of the defrosting operation. For example, the system may determine that an exit condition has occurred when a safety interlock is breached. Alternatively, the system may determine that an exit condition has occurred upon expiration of a timer that was set by the user (e.g., through user interface 320, FIG. 3) or upon expiration of a timer that was established by the system controller based on the system controller's estimate of how long the defrosting operation should be performed. In still another alternate embodiment, the system may otherwise detect completion of the defrosting operation.

If an exit condition has not occurred, then the defrosting operation may continue by iteratively performing blocks 922 and 924 (and the matching network reconfiguration process 910, as necessary). When an exit condition has occurred, then in block 928, the system controller causes the supply of the RF signal by the RF signal source to be discontinued. For example, the system controller may disable the RF signal generator (e.g., RF signal generator 342, FIG. 3) and/or may cause the power supply and bias circuitry (e.g., circuitry 350, FIG. 3) to discontinue provision of the supply current. In addition, the system controller may send signals to the user interface (e.g., user interface 320, FIG. 3) that cause the user interface to produce a user-perceptible indicia of the exit condition (e.g., by displaying "door open" or "done" on a display device, or providing an audible tone). The method may then end.

It should be understood that the order of operations associated with the blocks depicted in FIG. 9 corresponds to an example embodiment, and should not be construed to limit the sequence of operations only to the illustrated order. Instead, some operations may be performed in different orders, and/or some operations may be performed in parallel.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

An embodiment of a thermal increase system is electrically coupled to a cavity for containing a load. The thermal increase system includes an RF signal source configured to supply an RF signal, a transmission path electrically coupled between an output of the RF signal source and a first electrode that is positioned within the cavity, and an impedance matching network electrically coupled along the transmission path between the output of the RF signal source and the first electrode. The impedance matching network includes a first variable inductance network. The system also includes power detection circuitry configured to detect reflected signal power along the transmission path, and a controller configured to modify, based on the reflected signal power, an inductance value of the first variable inductance network to reduce a ratio of the reflected signal power to the forward signal power.

The impedance matching network may further comprise: a plurality of lumped inductors with fixed inductance values coupled to the first electrode; and wherein the first variable inductance network is coupled between the output of the RF signal source and a ground reference node. The plurality of lumped inductors may comprise: a first lumped inductor coupled between the output of the RF signal source and an intermediate node; and a second lumped inductor coupled between the intermediate node and the first electrode. The impedance matching network may further comprise: a second variable inductance network, wherein the first variable inductance network is coupled in shunt between the intermediate node and the ground reference node, and the second variable inductance network is coupled in shunt between the output of the RF signal source and the ground reference node. The first variable inductance network may correspond to an impedance matching network for the RF signal source; and the second variable inductance network corresponds to an impedance matching network for the cavity, and wherein during a thermal increase operation, the controller is configured to increase an inductance value of the first variable inductance network and to decrease an inductance value of the second variable inductance network. The first variable inductance network may comprise: a plurality of inductors coupled in series between the output of the RF signal source and a ground reference node; and a plurality of bypass switches, each coupled in parallel with an inductor of the plurality of inductors, wherein an inductance value of the first variable inductance network is determined by states of the plurality of bypass switches, and the states of the plurality of bypass switches is controlled by the controller. At least some of the plurality of inductors may have different inductance values. The power detection circuitry may be further configured to detect the forward signal power along the transmission path.

Another embodiment of a thermal increase system includes and RF signal source configured to produce an RF signal, a transmission path electrically coupled between an output of the RF signal source and a first electrode that is positioned within the cavity, a first electrode having first and second surfaces, where the first surface of the first electrode faces the cavity, and an impedance matching network electrically coupled along the transmission path. The impedance matching network includes a plurality of fixed-value, lumped inductors positioned within a fixed inductor area, and the second surface of the first electrode faces the fixed inductor area.

The impedance matching network may comprise: first lumped inductor coupled between an output of the RF signal source and a first node; a second lumped inductor coupled between the first node and the first electrode; a third lumped inductor coupled in shunt between the first node and a ground reference node; and a fourth lumped inductor coupled in shunt between the first electrode and the ground reference node. The impedance matching network may further comprise: a first variable inductance network coupled in shunt between the output of the RF signal source and the ground reference node; and a second variable inductance network coupled in series with the third lumped inductor between the first node and the ground reference node. The first variable inductance network may comprise a first plurality of inductors coupled in series between the output of the RF signal source and the ground reference node, and a first plurality of bypass switches coupled in parallel with the first plurality of inductors, wherein an inductance value of the first variable inductance network is determined by states of the first plurality of bypass switches, and the states of the first plurality of bypass switches is controlled by the controller; and the second variable inductance network may comprise a second plurality of inductors coupled in series between the first node and the ground reference node, and a second plurality of bypass switches coupled in parallel with the second plurality of inductors, wherein an inductance value of the second variable inductance network is determined by states of the second plurality of bypass switches, and the states of the second plurality of bypass switches is controlled by the controller. The thermal increase system may include the RF signal having a forward signal power along the transmission path; and the thermal increase system further comprises power detection circuitry configured to detect reflected signal power along the transmission path, and a controller configured to modify a first inductance value of the first variable inductance network and a second inductance value of the second variable inductance network to reduce a ratio of the reflected signal power to the forward signal power. An embodiment of a method of operating a thermal increase system that includes a cavity includes supplying, by an RF signal source, an RF signal to a transmission path that is coupled between an output of the RF signal source and an electrode that is positioned within the cavity, where the RF signal has a forward signal power. The method also includes detecting, by power detection circuitry, reflected signal power along the transmission path, and modifying, by a controller, an inductance value of a first variable inductance network coupled to the transmission path to reduce the reflected signal power.

The method may further comprise: detecting, by the power detection circuitry, the forward signal power; calculating, by the controller, the ratio of the reflected signal power to the forward signal power; determining, by the controller, whether the ratio is above a threshold; and when the ratio is above the threshold, performing the modifying step. Modifying the inductance value may comprise: decreasing a power level of the RF signal to a relatively low power level; modifying, by the controller, the inductance value of the first variable inductance network; again detecting, by the power detection circuitry, the reflected signal power; determining, by the controller, whether the reflected power is acceptable; and when the reflected power is not acceptable, repeating the modifying, again detecting, and determining steps. The method may further comprise: when the reflected power is determined to be acceptable, increasing the power level of the RF signal to a relatively high power level. The method may further comprise: also modifying, by the controller, an inductance value of a second variable inductance network coupled to the transmission path to reduce the reflected signal power, wherein the first variable inductance network corresponds to an impedance matching network for the RF signal source, and the second variable inductance network corresponds to an impedance matching network for the cavity. During a thermal increase operation, the controller may be configured to increase the inductance value of the first variable inductance network while reducing the inductance value of the second variable inductance network. The first variable inductance network may include a plurality of inductors coupled in series, and a plurality of bypass switches coupled in parallel with the plurality of inductors, wherein an inductance value of the first variable inductance network is determined by states of the plurality of bypass switches, and the states of the plurality of bypass switches is controlled by the controller; and wherein modifying the inductance value of the first variable inductance network comprises the controller providing control signals to the plurality of bypass switches to modify the states of the plurality of bypass switches.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. A thermal increase system electrically coupled to a cavity for containing a load, the thermal increase system comprising:
   a radio frequency (RF) signal source configured to supply an RF signal;
   a transmission path electrically coupled between an output of the RF signal source and a first electrode that is positioned within the cavity, wherein the RF signal has a forward signal power along the transmission path;
   an impedance matching network electrically coupled along the transmission path between the output of the RF signal source and the first electrode, wherein the impedance matching network is an inductor-only network that does not include capacitors, and the impedance matching network comprises
      a first lumped inductor with a first terminal connected to the output of the RF signal source, and a second terminal connected to an intermediate node,
      a second lumped inductor with a first terminal connected to the intermediate node, and a second terminal connected to the electrode,
      a first variable inductance network coupled in shunt between the intermediate node and a ground reference node, and
      a second variable inductance network coupled in shunt between the output of the RF signal source and the ground reference node;
   power detection circuitry configured to detect reflected signal power along the transmission path; and
   a controller configured to modify, based on the reflected signal power, an inductance value of the first variable inductance network to reduce a ratio of the reflected signal power to the forward signal power.

2. The thermal increase system of claim 1, wherein the impedance matching network further comprises:
   a plurality of lumped inductors, including the first lumped inductor and the second lumped inductor, with fixed inductance values coupled to the first electrode.

3. The thermal increase system of claim 1, wherein:
   the second variable inductance network corresponds to an impedance matching network for the RF signal source; and
   the first variable inductance network corresponds to an impedance matching network for the cavity, and
   wherein during a thermal increase operation, the controller is configured to increase an inductance value of the second variable inductance network and to decrease an inductance value of the first variable inductance network.

4. The thermal increase system of claim 1, wherein:
   the second variable inductance network comprises:
      a first plurality of inductors coupled in series between the output of the RF signal source and the ground reference node, and
      a first plurality of bypass switches coupled in parallel with the first plurality of inductors, wherein an inductance value of the second variable inductance network is determined by states of the first plurality of bypass switches, and the states of the first plurality of bypass switches is controlled by the controller; and
   the first variable inductance network comprises:
      a second plurality of inductors coupled in series between the intermediate node and the ground reference node, and
      a second plurality of bypass switches coupled in parallel with the second plurality of inductors, wherein an inductance value of the first variable inductance network is determined by states of the second plurality of bypass switches, and the states of the second plurality of bypass switches is controlled by the controller.

5. The thermal increase system of claim 1, wherein the first second variable inductance network comprises:
   a plurality of inductors coupled in series between the output of the RF signal source and the ground reference node; and
   a plurality of bypass switches, each coupled in parallel with an inductor of the plurality of inductors, wherein an inductance value of the second variable inductance network is determined by states of the plurality of bypass switches, and the states of the plurality of bypass switches are controlled by the controller.

6. The thermal increase system of claim 5, wherein at least some of the plurality of inductors have different inductance values.

7. The thermal increase system of claim 1, wherein:
   the power detection circuitry is further configured to detect the forward signal power along the transmission path.

8. The thermal increase system of claim 1, wherein the impedance matching network further comprises:
a third lumped inductor coupled in shunt between the intermediate node and a ground reference node; and
a fourth lumped inductor coupled in shunt between the first electrode and the ground reference node.

9. A method of operating a thermal increase system that includes a cavity, the method comprising: supplying, by a radio frequency (RF) signal source, an RF signal to a transmission path that is coupled between an output of the RF signal source and an electrode that is positioned within the cavity, wherein the RF signal has a forward signal power; detecting, by power detection circuitry, reflected signal power along the transmission path; and modifying, by a controller, an inductance value of a first variable inductance network and an inductance value of a second variable inductance network that are coupled to the transmission path to reduce the reflected signal power, wherein the first and second variable inductance networks form portions of an inductor-only impedance matching network that does not include capacitors with significant capacitance values, the inductor-only impedance matching network further includes a first lumped inductor coupled between with a first terminal connected to an output of the RF signal source and a second terminal connected to an intermediate node, and a second lumped inductor with a first terminal connected to the intermediate node, and a second terminal connected to the electrode, the first variable inductance network is coupled in shunt between the intermediate node and a ground reference node, and the second variable inductance network is coupled in shunt between the output of the RF signal source and the ground reference node.

10. The method of claim 9, further comprising: detecting, by the power detection circuitry, the forward signal power; calculating, by the controller, the ratio of the reflected signal power to the forward signal power; determining, by the controller, whether the ratio is above a threshold; and when the ratio is above the threshold, performing the modifying step.

11. The method of claim 9, wherein the modifying the inductance value comprises: decreasing a power level of the RF signal to a relatively low power level; modifying, by the controller, the inductance value of the first variable inductance network; again detecting, by the power detection circuitry, the reflected signal power; determining, by the controller, whether the reflected power is acceptable; and when the reflected power is not acceptable, repeating the modifying, again detecting, and determining steps.

12. The method of claim 9, wherein the first second variable inductance network corresponds to an impedance matching network for the RF signal source, and the second first variable inductance network corresponds to an impedance matching network for the cavity.

13. The method of claim 12, wherein, during a thermal increase operation, the controller is configured to increase the inductance value of the first second variable inductance network while reducing the inductance value of the second first variable inductance network.

14. A thermal increase system electrically coupled to a cavity for containing a load, the thermal increase system comprising:
a radio frequency (RF) signal source configured to produce an RF signal;
a transmission path electrically coupled between an output of the RF signal source and a first electrode that is positioned within the cavity;
a first electrode having first and second surfaces, wherein the first surface of the first electrode faces the cavity; and
an impedance matching network electrically coupled along the transmission path between an output of the RF signal source and the first electrode, wherein the impedance matching network is an inductor-only network that does not include capacitors, and the impedance matching network comprises
a plurality of fixed-value inductors positioned within a fixed inductor area, wherein the second surface of the first electrode faces the fixed inductor area, and the plurality of fixed-value inductors includes a first fixed-value inductor and a second fixed-value inductor, wherein the first fixed-value inductor has a first terminal connected to an output of the RF signal source, and a second terminal connected to a first node, and wherein the second fixed-value inductor has a first terminal connected to the first node, and a second terminal connected to the first electrode;
a first variable inductance network coupled in shunt between the output of the RF signal source and a ground reference node, and
a second variable inductance network coupled in shunt between the first node and the ground reference node.

15. The thermal increase system of claim 14, wherein the impedance matching network further comprises:
a third fixed-value inductor coupled in series with the second variable inductance network between the first node and a ground reference node; and
a fourth fixed-value inductor coupled in shunt between the first electrode and the ground reference node.

16. The thermal increase system of claim 14, wherein:
the first variable inductance network comprises
a first plurality of inductors coupled in series between the output of the RF signal source and the ground reference node, and
a first plurality of bypass switches coupled in parallel with the first plurality of inductors, wherein an inductance value of the first variable inductance network is determined by states of the first plurality of bypass switches, and the states of the first plurality of bypass switches is controlled by the controller; and
the second variable inductance network comprises
a second plurality of inductors coupled in series between the first node and the ground reference node, and
a second plurality of bypass switches coupled in parallel with the second plurality of inductors, wherein an inductance value of the second variable inductance network is determined by states of the second plurality of bypass switches, and the states of the second plurality of bypass switches is controlled by the controller.

17. The thermal increase system of claim 14, wherein: the RF signal has a forward signal power along the transmission path; and the thermal increase system further comprises power detection circuitry configured to detect reflected signal power along the transmission path, and a controller configured to modify a first inductance value of the first variable inductance network and a second inductance value of the second variable inductance network to reduce a ratio of the reflected signal power to the forward signal power.

* * * * *